(12) United States Patent
Mukherjee et al.

(10) Patent No.: US 10,935,980 B2
(45) Date of Patent: Mar. 2, 2021

(54) AUTOMATED MAINTENANCE OF DATACENTER COMPUTERS USING MOBILE ROBOTIC MANIPULATORS

(71) Applicant: International Business Machines Corporation, Armonk, NY (US)

(72) Inventors: Maharaj Mukherjee, Poughkeepsie, NY (US); Gregory J. Boss, Saginaw, MI (US); Monimala Mukherjee, Poughkeepsie, NY (US); Jimi Lin, Brossard (CA)

(73) Assignee: International Business Machines Corporation, Armonk, NY (US)

( * ) Notice: Subject to any disclaimer, the term of this patent is extended or adjusted under 35 U.S.C. 154(b) by 224 days.

(21) Appl. No.: 16/128,656

(22) Filed: Sep. 12, 2018

(65) Prior Publication Data

US 2020/0081439 A1   Mar. 12, 2020

(51) Int. Cl.
*B25J 11/00*   (2006.01)
*G05D 1/02*   (2020.01)
*B25J 9/16*   (2006.01)
*B25J 5/00*   (2006.01)

(52) U.S. Cl.
CPC ............ *G05D 1/0212* (2013.01); *B25J 5/007* (2013.01); *B25J 9/1664* (2013.01); *B25J 11/008* (2013.01); *G05B 2219/24019* (2013.01)

(58) Field of Classification Search
CPC ..... G05D 1/0212; B25J 11/008; B25J 9/1664; B25J 5/007; B25J 9/023; B25J 9/04; B25J 15/0047; G05B 2219/24019
See application file for complete search history.

(56) References Cited

U.S. PATENT DOCUMENTS

| 4,742,609 A | 5/1988 | Neumann | |
|---|---|---|---|
| 6,085,154 A * | 7/2000 | Leuthausser | G07C 5/00 701/29.4 |
| 7,373,559 B2 * | 5/2008 | Guha | G06F 11/008 714/54 |
| 7,389,396 B1 * | 6/2008 | Goel | G06F 11/0727 711/112 |

(Continued)

OTHER PUBLICATIONS

Kuo et al., "Design for Manufacturability and Design for "X": Concepts, Applications, and Perspectives", Copyright 1995 IEEE, pp. 446-459.

(Continued)

*Primary Examiner* — Khoi H Tran
*Assistant Examiner* — Jorge O Peche
(74) *Attorney, Agent, or Firm* — Nicholas D. Bowman; Maxine L. Barasch; Keohane & D'Alessandro, PLLC

(57) ABSTRACT

Disclosed embodiments provide techniques for automated replacement of components in a datacenter. A robot is instructed to follow a route to replace parts within a datacenter. Embodiments include predicting a failure rate for a plurality of computer components within a datacenter. A failure time is then predicted for the computer components based on the corresponding failure rate. A route is created that allows the robot to visit the one or more racks containing the computer components that need to be replaced. The robot then replaces the components that require replacing. In this way, datacenter efficiency is improved and operating costs are reduced.

18 Claims, 21 Drawing Sheets

(56) References Cited

U.S. PATENT DOCUMENTS

| | | | | |
|---|---|---|---|---|
| 8,401,726 B2* | 3/2013 | Bouvier | ............... | G07C 5/006 |
| | | | | 701/29.1 |
| 8,661,130 B2* | 2/2014 | Sonoda | ............... | H04L 67/1002 |
| | | | | 709/226 |
| 9,024,771 B1* | 5/2015 | Kuffner, Jr. | ............ | B25J 9/0084 |
| | | | | 340/679 |
| 9,908,239 B1* | 3/2018 | O'Brien | ............... | G05D 1/0282 |
| 2005/0113978 A1 | 5/2005 | Sharma et al. | | |
| 2005/0262462 A1* | 11/2005 | Janakiraman | ......... | G06F 11/008 |
| | | | | 703/1 |
| 2007/0094535 A1* | 4/2007 | Prasee | ..................... | B25J 5/007 |
| | | | | 714/5.11 |
| 2012/0185579 A1 | 7/2012 | Watanabe | | |
| 2015/0028918 A1* | 1/2015 | Hutton | ............... | H03K 19/0033 |
| | | | | 326/9 |
| 2015/0100680 A1* | 4/2015 | Djuric | .................... | H04L 43/12 |
| | | | | 709/224 |
| 2015/0202770 A1* | 7/2015 | Patron | ................. | G06Q 20/386 |
| | | | | 700/245 |
| 2016/0350567 A1* | 12/2016 | McQuade | ........ | G06K 19/06028 |
| 2016/0359683 A1* | 12/2016 | Bartfai-Walcott | ........................... | |
| | | | | H04L 41/5009 |
| 2017/0286176 A1* | 10/2017 | Artman | .................. | G06F 9/5027 |
| 2017/0364271 A1* | 12/2017 | Han | .................... | G06F 11/1076 |
| 2018/0186208 A1* | 7/2018 | Coombs | ............ | B60G 17/0416 |
| 2018/0247256 A1* | 8/2018 | Takigawa | ............. | G06Q 10/087 |
| 2020/0118222 A1* | 4/2020 | Bidram | ............ | G06Q 10/06393 |
| 2020/0229206 A1* | 7/2020 | Badic | ................... | H04B 17/318 |

OTHER PUBLICATIONS

Hamilton et al., "Horizon Scan 2", Apr. 2017, 37 pages.
De Mello et al., "Planning Repair Sequences Using The And/Or Graph Representation of Assembly Plans", Copyright 1988 IEEE, pp. 1861-1862.
Laborie et al., "IxTeT: an Integrated Approach for Plan Generation and Scheduling", 1995 INRIA/IEEE Symposium on vol. 1, 12 pages.
AMIDI, "Integrated Mobile Robot Control", May 1990, 37 pages.

* cited by examiner

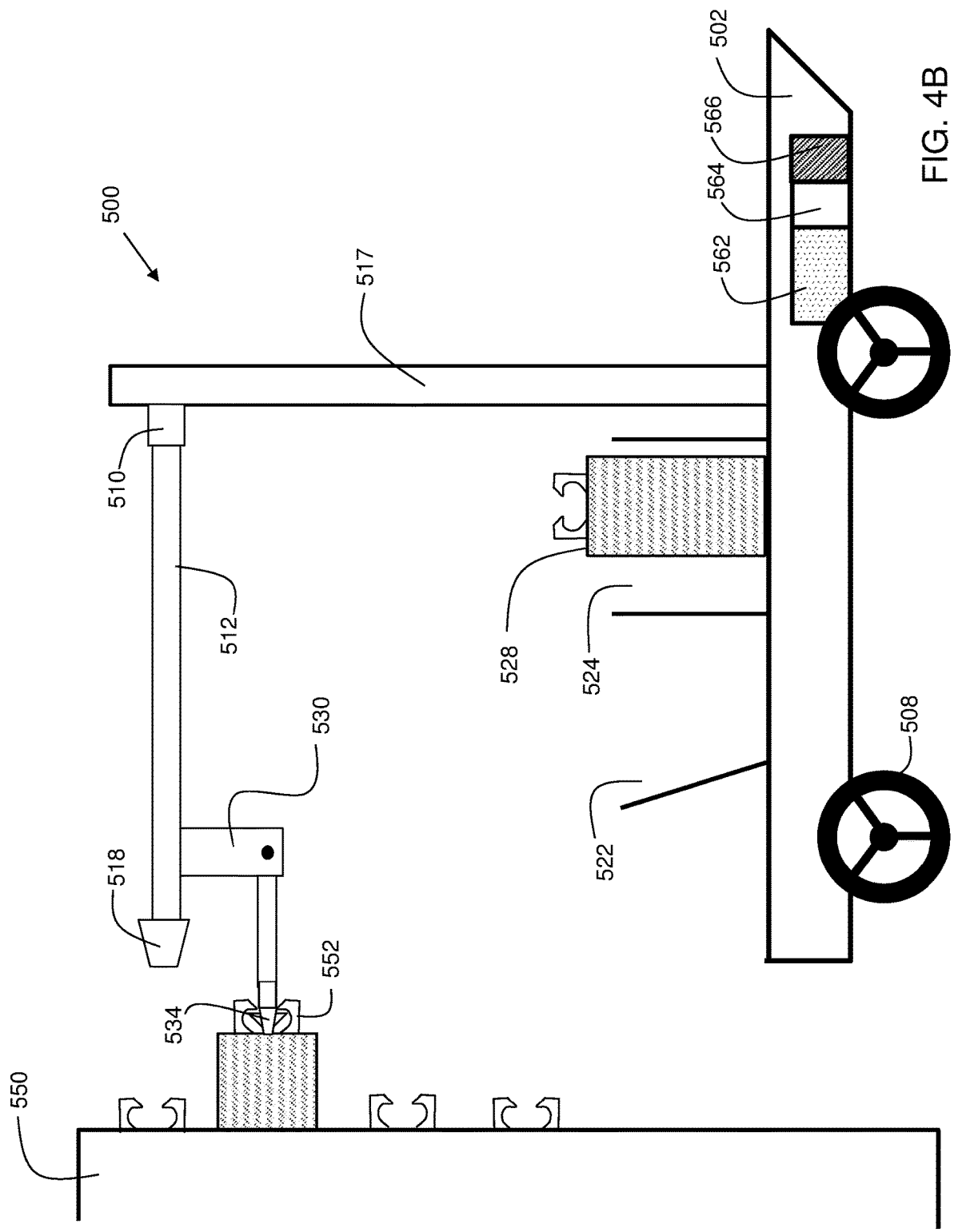

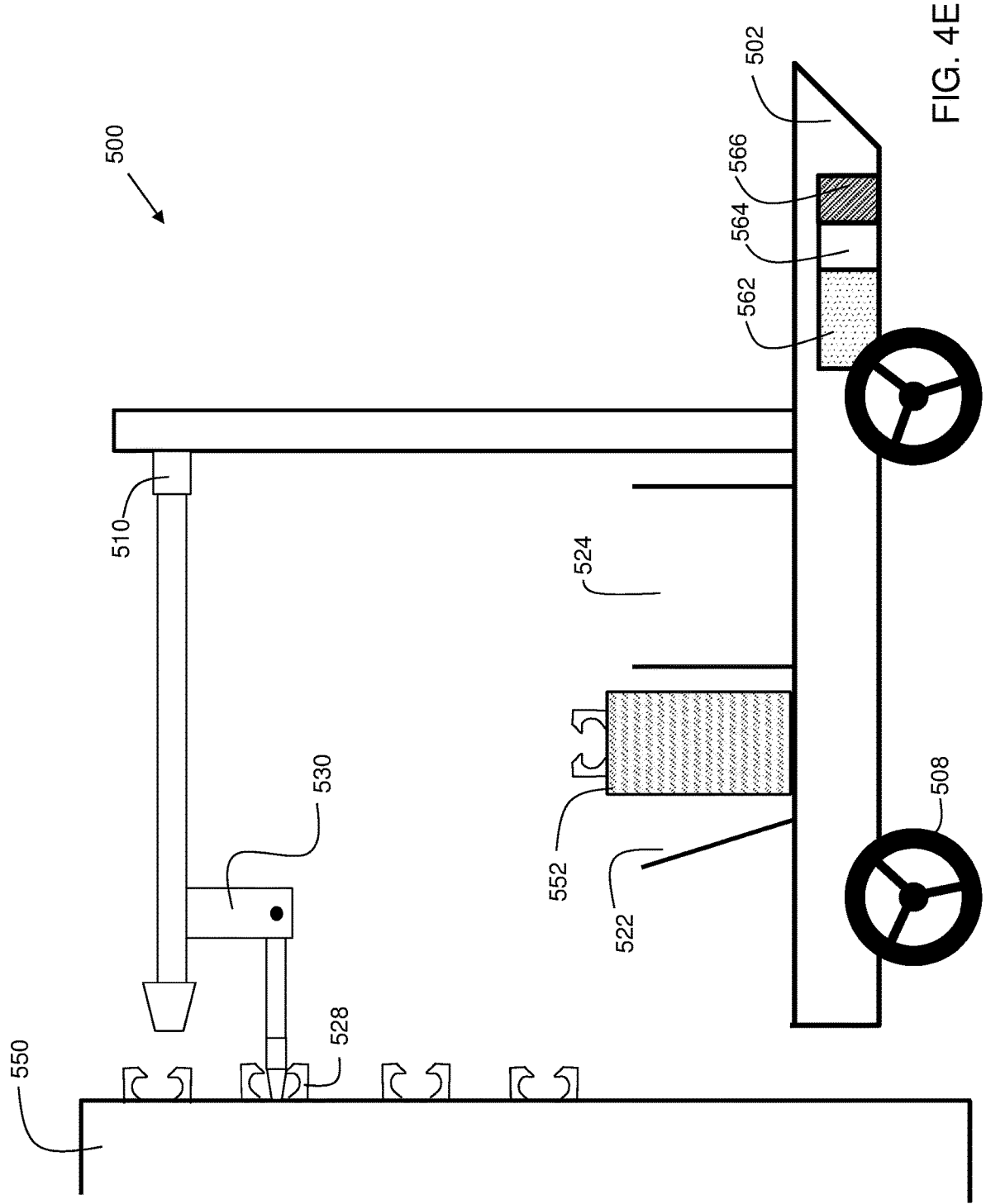

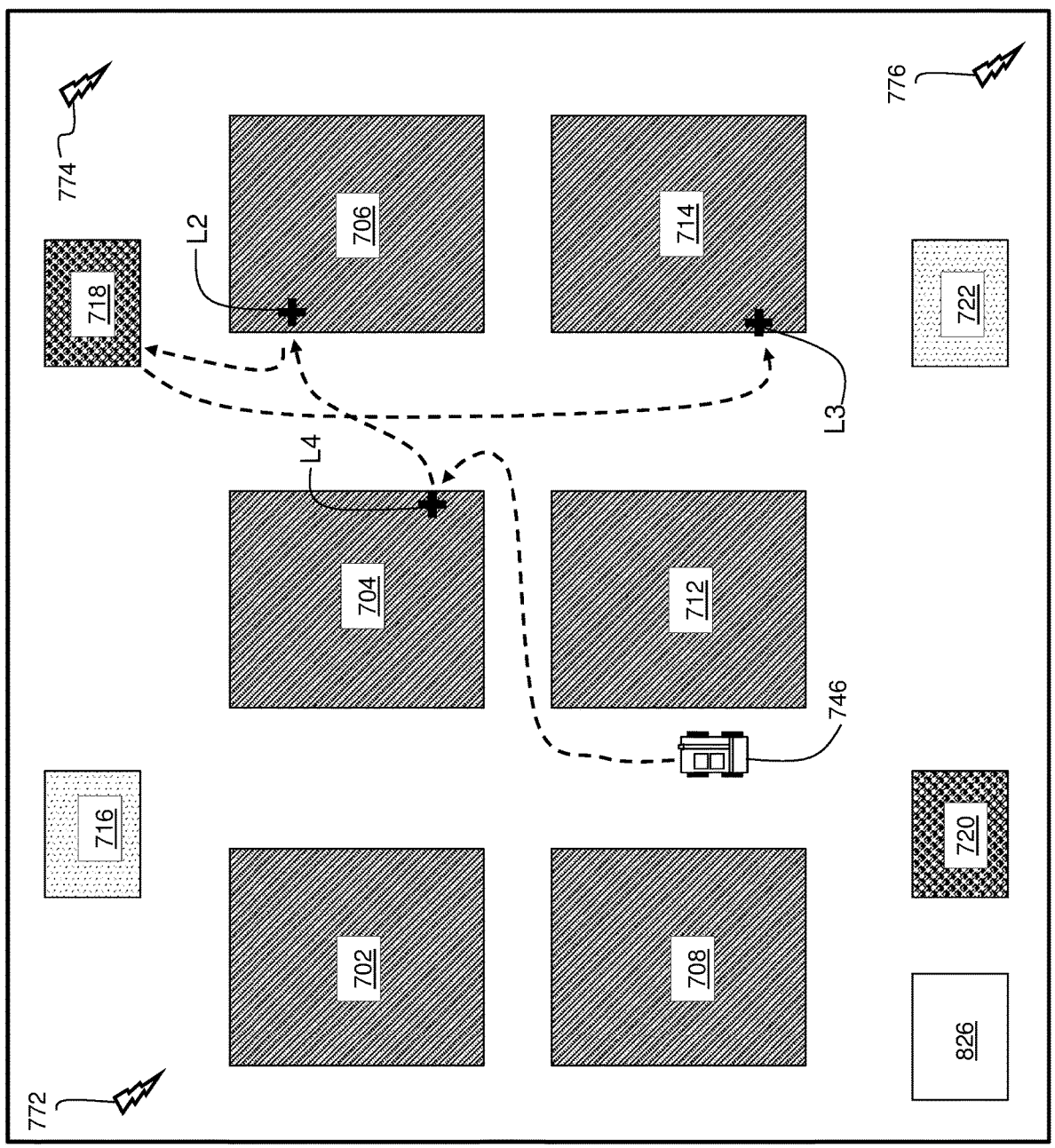

| LOC | PART | DIST | TIME | ON BOARD | TIME WINDOW | HSP | PRIORITY |
|---|---|---|---|---|---|---|---|
| R3S1P3 | FX-5C | 30 | 2:00 | Y | 15:00 | ON | 2 |
| R21S3P7 | THX-1 | 80 | 4:12 | Y | 18:00 | STBY | 2 |
| R34S2P5 | C3P-0 | 52 | 3:41 | Y | 4:00 | ON | 1 |
| R528S2P1 | FX-5C | 352 | 12:17 | N | 59:00 | ON | 3 |
| R5S2P8 | STRN5 | 75 | 4:07 | N | 45:00 | OFF | 3 |

FIG. 12

AUTOMATED MAINTENANCE OF DATACENTER COMPUTERS USING MOBILE ROBOTIC MANIPULATORS

FIELD

Embodiments of the invention relate to automated maintenance of datacenter computers and, more specifically, automated maintenance of data center computers using mobile robotic manipulators.

BACKGROUND

Modern datacenters are very large. They can house tens of thousands of computers, or even more. Datacenters often include non-uniform servers, which complicates maintenance procedures. Servers are typically equipped with monitoring software that sends notifications relating to equipment component failure, but conventionally, replacement of failed components is done manually. Manually obtaining the proper components to replace failed components at the applicable location is time consuming and adds to computer down time. There exists a need for improvements in datacenter maintenance methods and systems.

SUMMARY

In one embodiment, there is provided a computer-implemented method for performing maintenance in a datacenter, comprising: predicting a failure rate for a plurality of computer components within a datacenter, wherein the plurality of computer components is installed within one or more racks within the datacenter; predicting a failure time for the plurality of computer components based on the corresponding predicted failure rate; selecting a subset of the plurality of computer components for replacement based on the predicted failure time; creating a route that visits the one or more racks containing the subset of the plurality of computer components; sending the route to a maintenance robot; sending a maintenance record corresponding to the subset of the plurality of computer components for replacement to the maintenance robot; and dispatching the maintenance robot to travel the route.

In another embodiment, there is provided an electronic computing device comprising: a processor; a memory coupled to the processor, the memory containing instructions, that when executed by the processor, perform the steps of: predicting a failure rate for a plurality of computer components within a datacenter, wherein the plurality of computer components is installed within one or more racks within the datacenter; predicting a failure time for the plurality of computer components based on the corresponding predicted failure rate; selecting a subset of the plurality of computer components for replacement based on the predicted failure time; creating a route that visits the one or more racks containing the subset of the plurality of computer components; sending the route to a maintenance robot; sending a maintenance record corresponding to the subset of the plurality of computer components for replacement to the maintenance robot; and dispatching the maintenance robot to travel the route.

In yet another embodiment, there is provided a computer program product for an electronic computing device comprising a computer readable storage medium having program instructions embodied therewith, the program instructions executable by a processor to cause the electronic computing device to perform the steps of: predicting a failure rate for a plurality of computer components within a datacenter, wherein the computer components are installed within one or more racks within the datacenter; predicting a failure time for the plurality of computer components based on the corresponding failure rate; selecting a subset of the plurality of computer components for replacement based on the predicted failure time; creating a route that visits the one or more racks containing the subset of the plurality of computer components; sending the route to a maintenance robot; sending a maintenance record corresponding to the subset of the plurality of computer components for replacement to the maintenance robot; and dispatching the maintenance robot to travel the route.

BRIEF DESCRIPTION OF THE DRAWINGS

Features of the disclosed embodiments will be more readily understood from the following detailed description of the various aspects of the invention taken in conjunction with the accompanying drawings.

FIG. 4B shows a side view of a robot used in embodiments of the present invention, in the process of removing a component from a datacenter rack.

FIG. 4E shows a side view of a robot used in embodiments of the present invention, after completely inserting a replacement component in a datacenter rack.

In embodiments, creating a route comprises creating a maximum priority route.

FIG. 7D shows an example of a maximum priority route with an added replacement candidate.

Figure 7A:
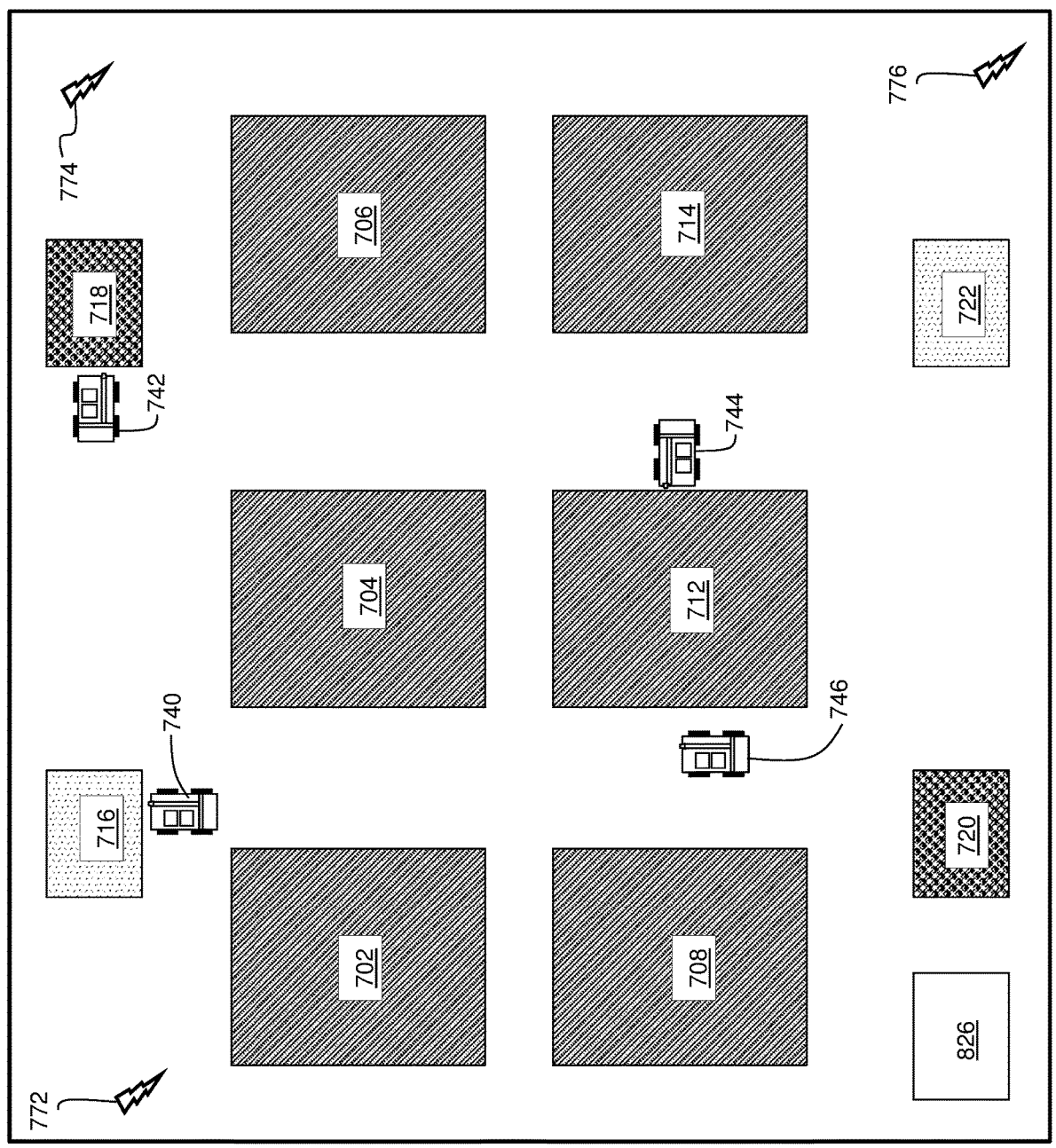
FIG. 7A shows an example datacenter location with multiple racks and multiple robots.
Figure 7B:
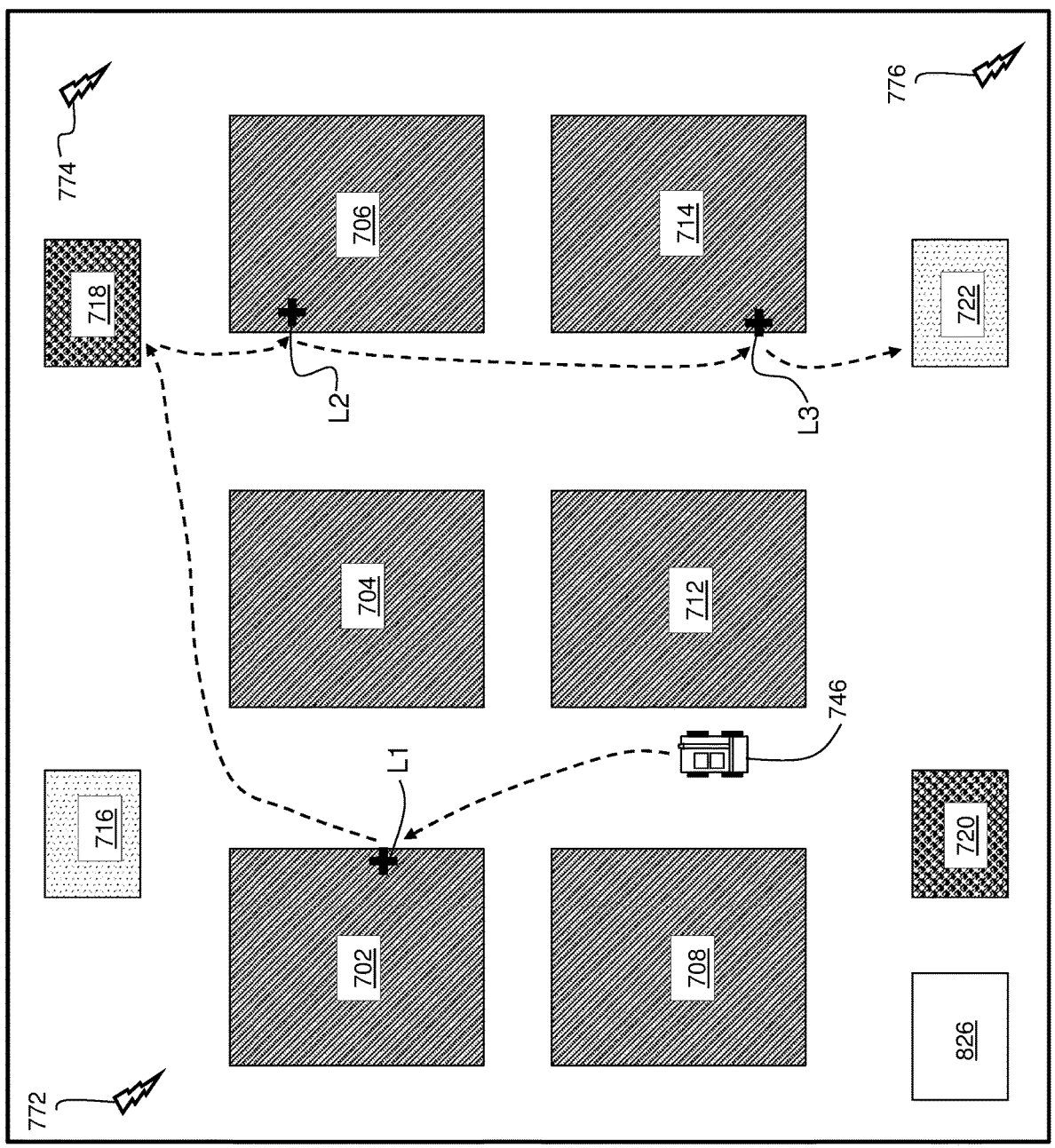
FIG. 7B shows an example travel path for a single robot embodiment.
Figure 7C:
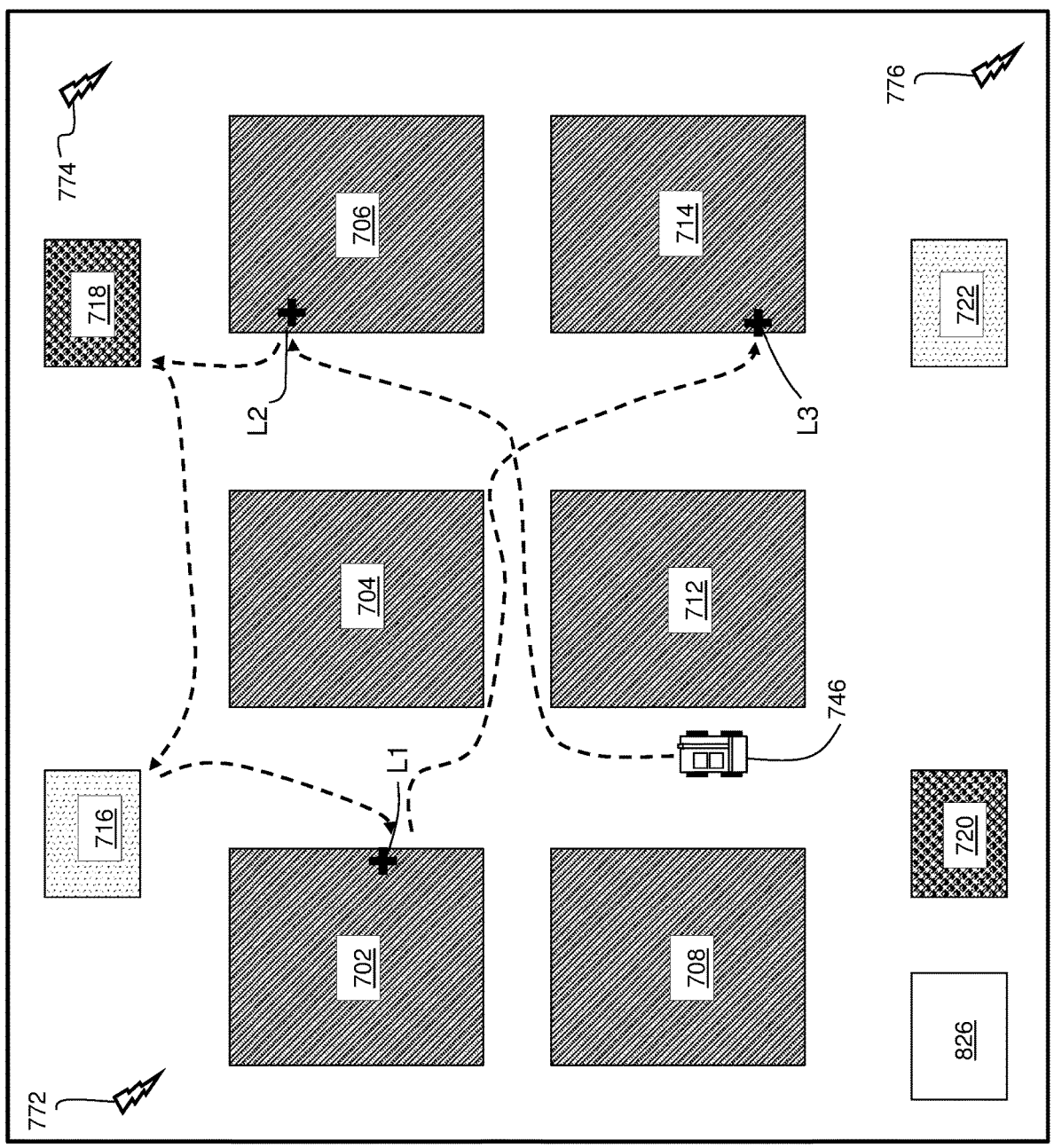
FIG. 7C shows an example of a maximum priority route.
Figure 7E:
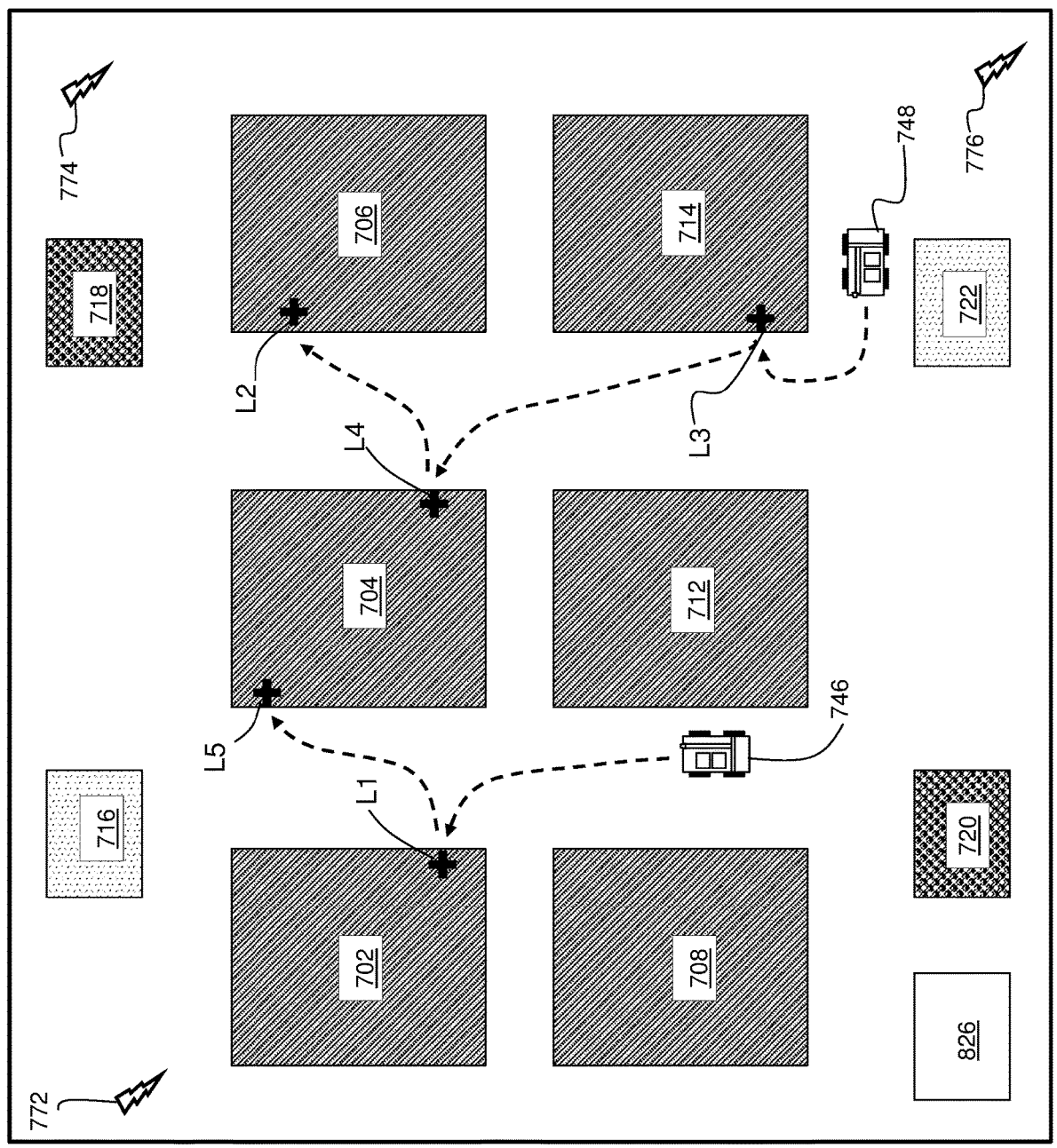

FIG. 7E shows an example of multiple robots handling different regions of a datacenter.

Figure 7F:
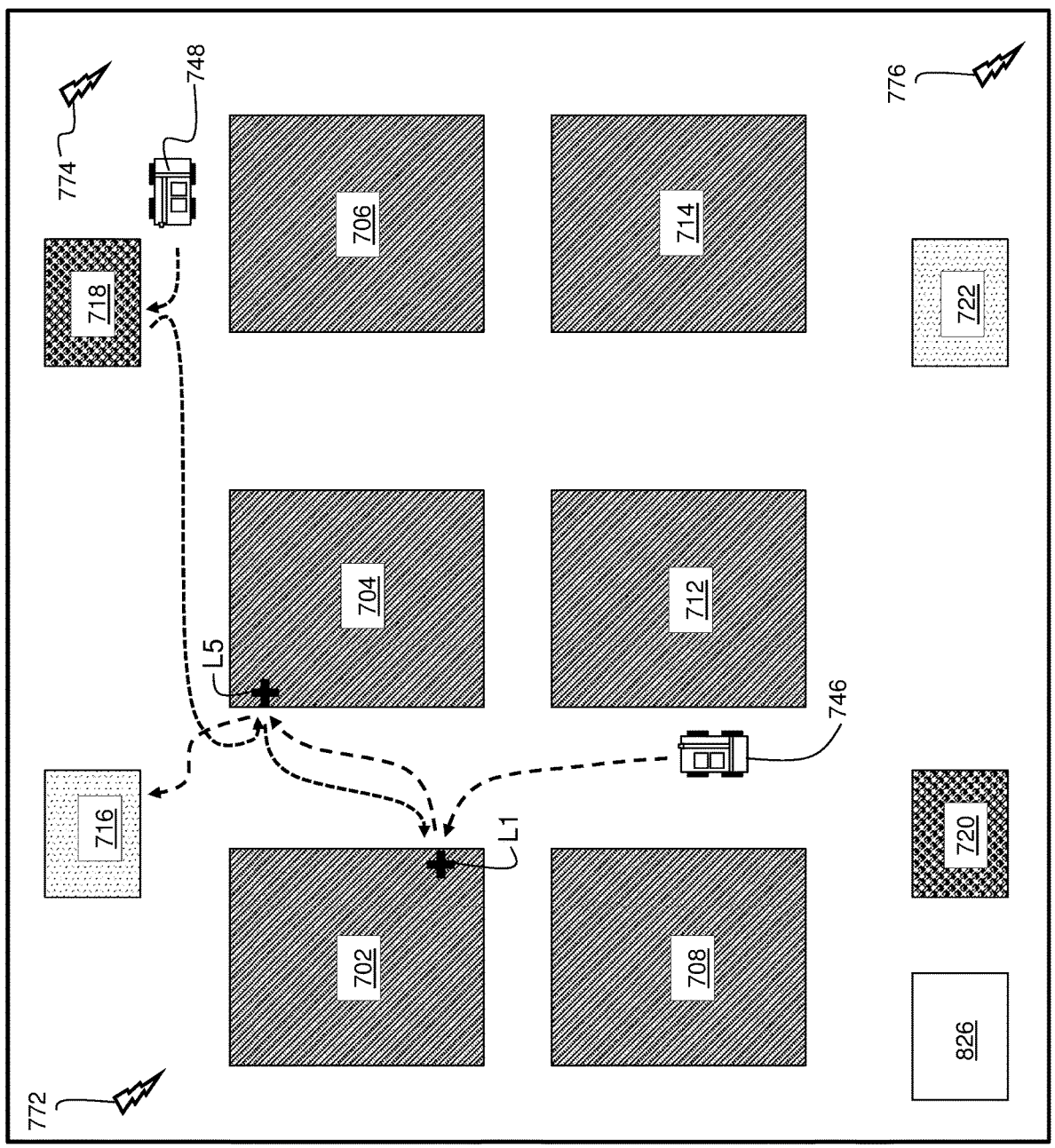

FIG. 7F shows an example of dedicated robots handling roles of replacement and insertion.

Figure 8:
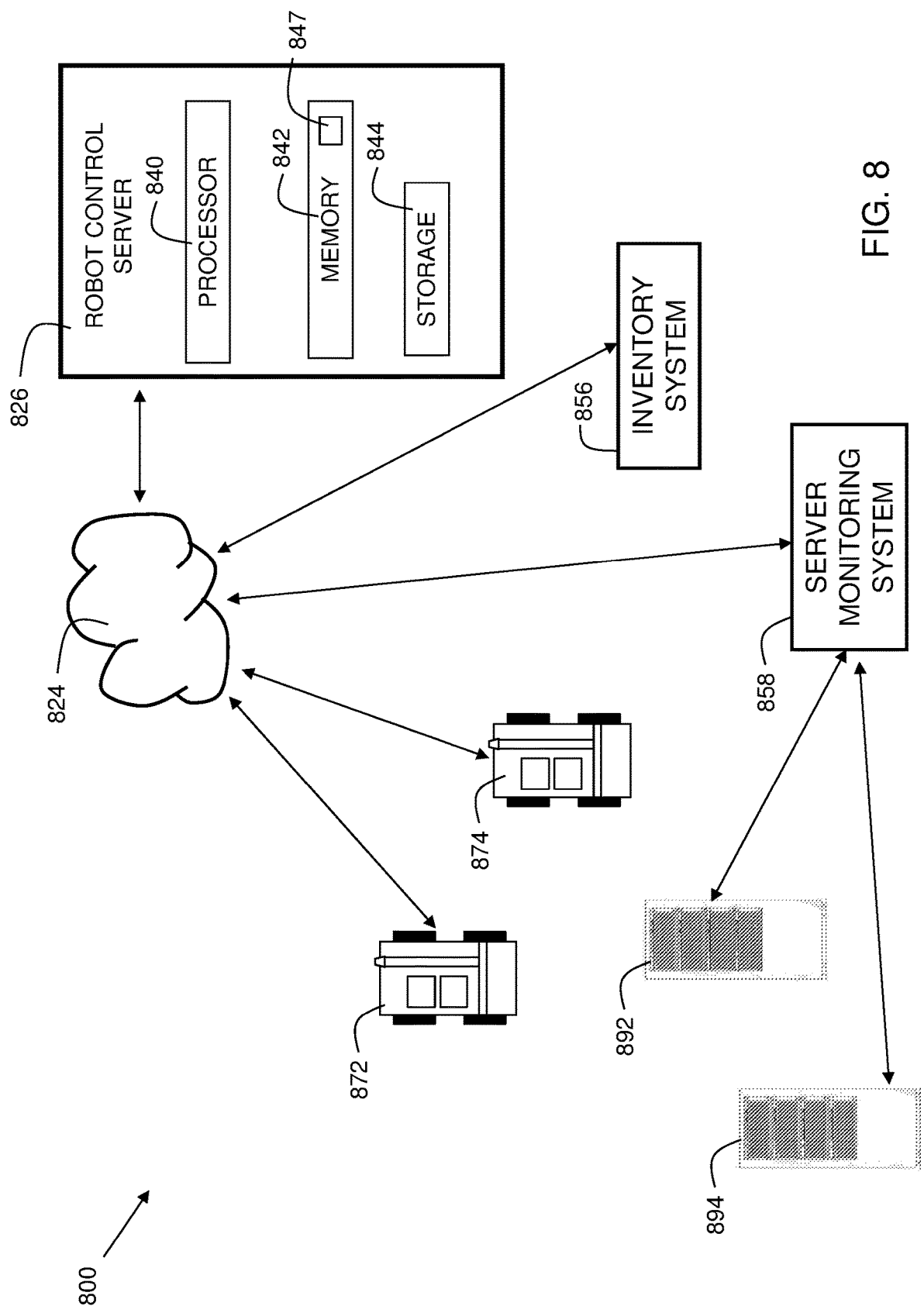

FIG. 8 shows an environment for embodiments of the present invention.

Figure 9:
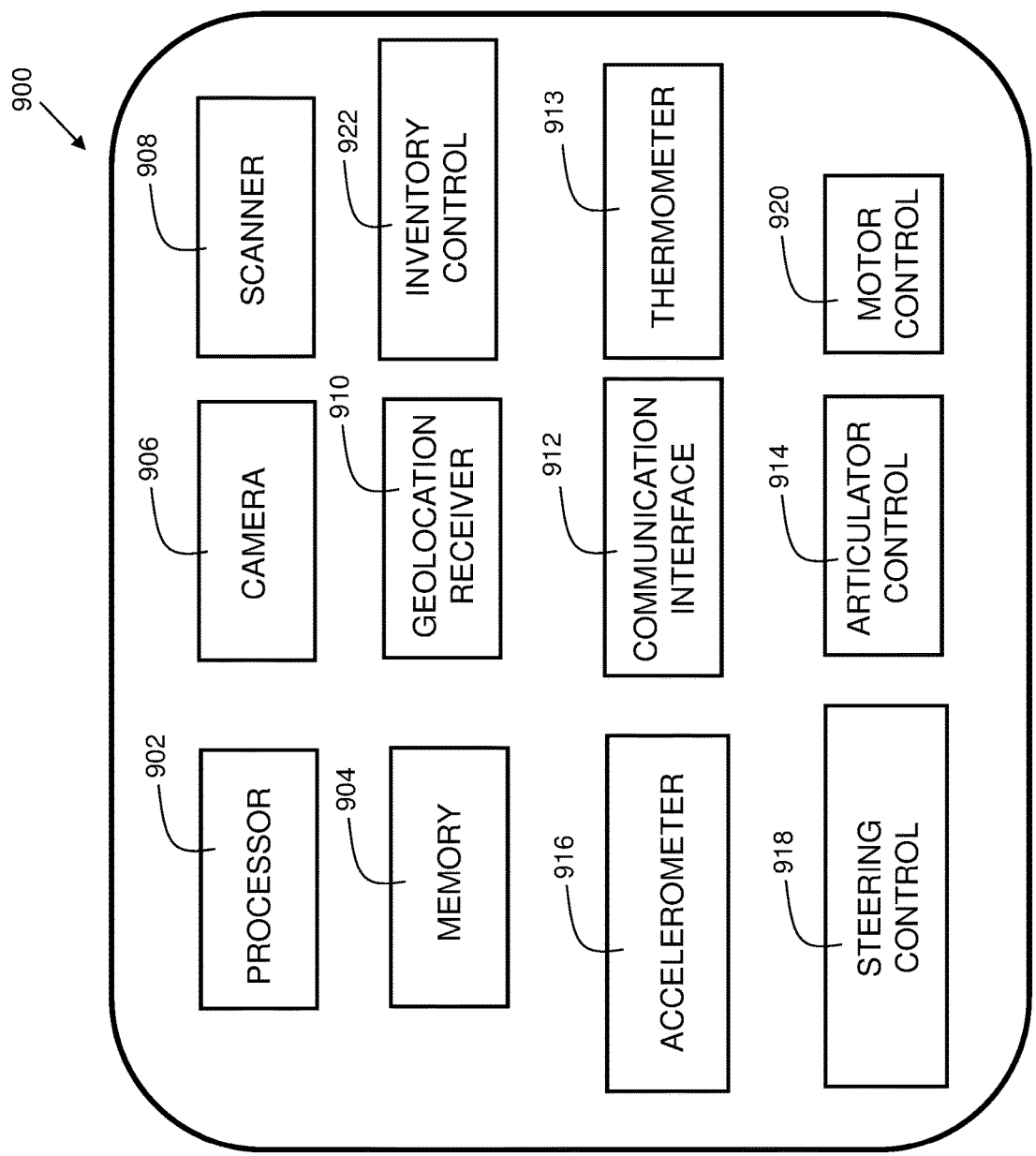

FIG. 9 is a block diagram for a robot in accordance with embodiments of the present invention.

Figure 10:
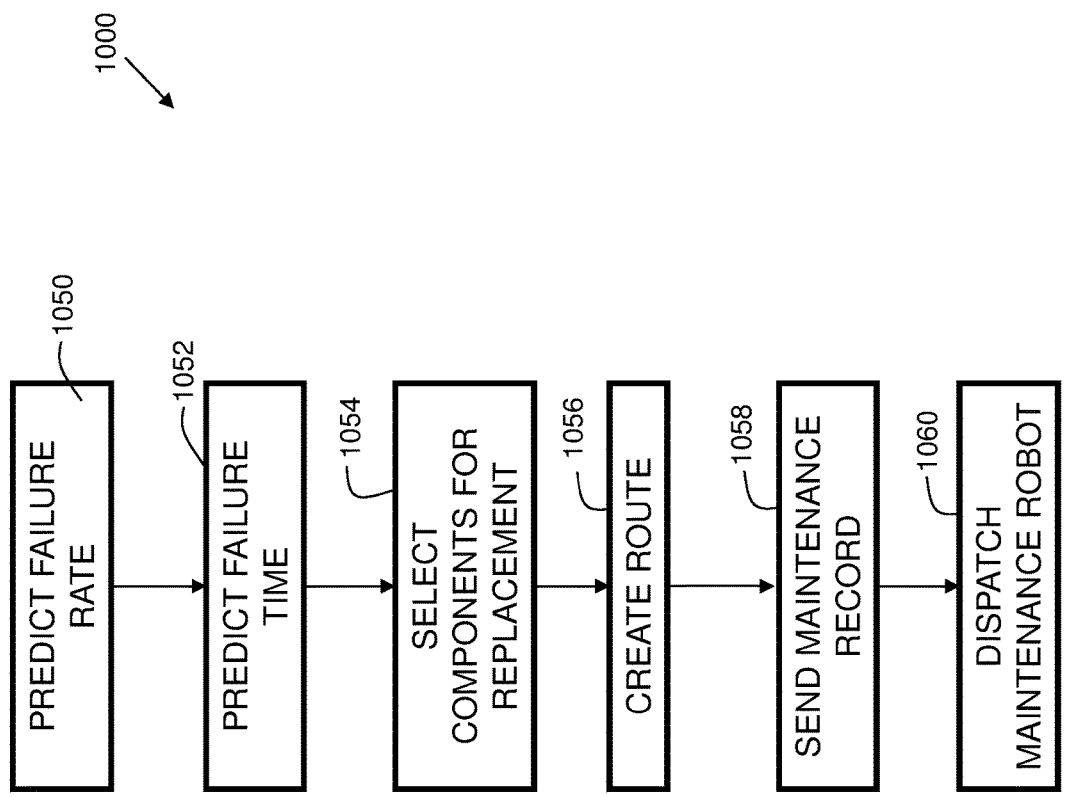

FIG. 10 is a flowchart indicating process steps for an embodiment of the present invention.

Figure 11:
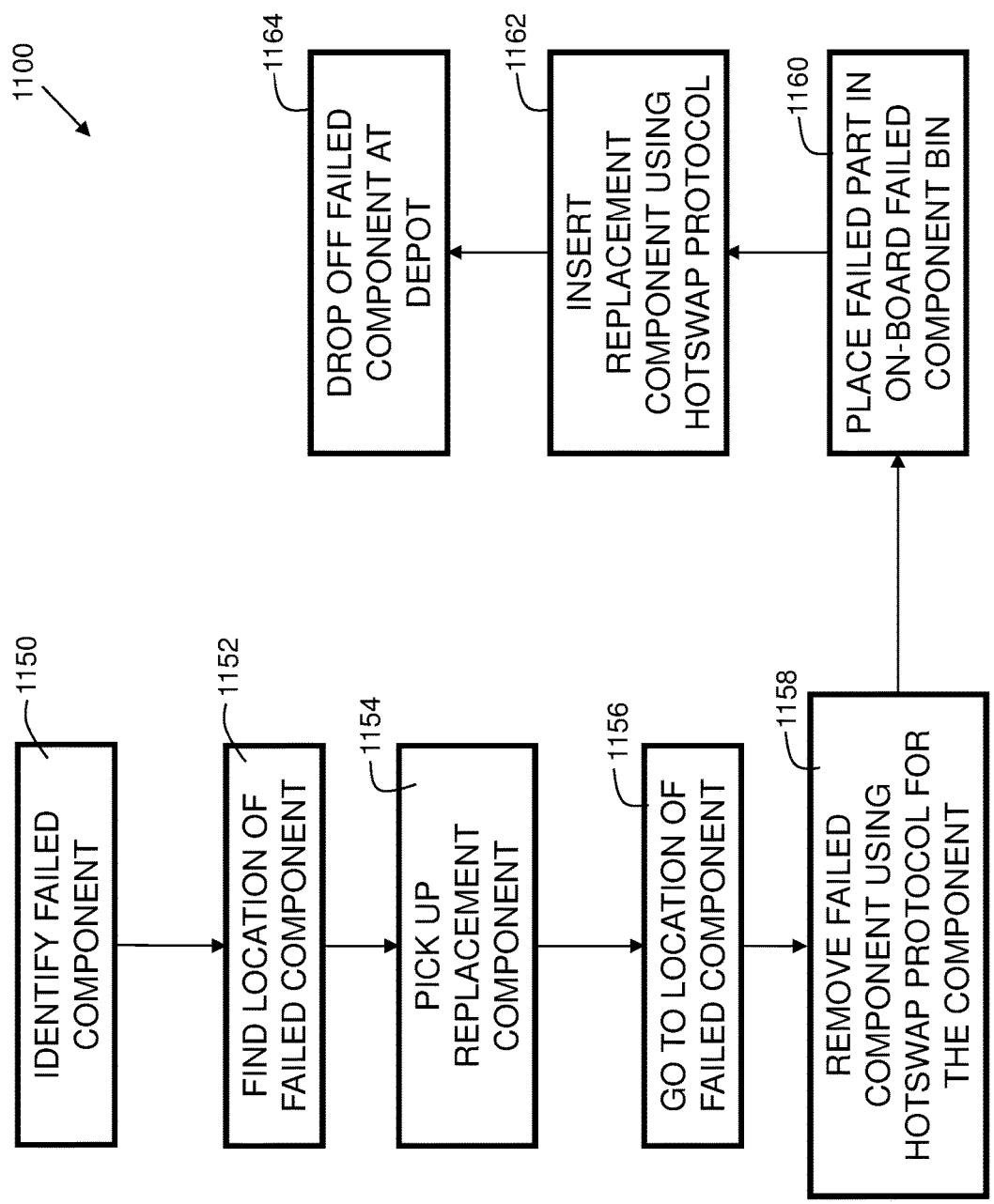

FIG. 11 is a flowchart indicating process steps for an additional embodiment of the present invention.

FIG. 12 is an example data structure for embodiments of the present invention.

Figure 13:
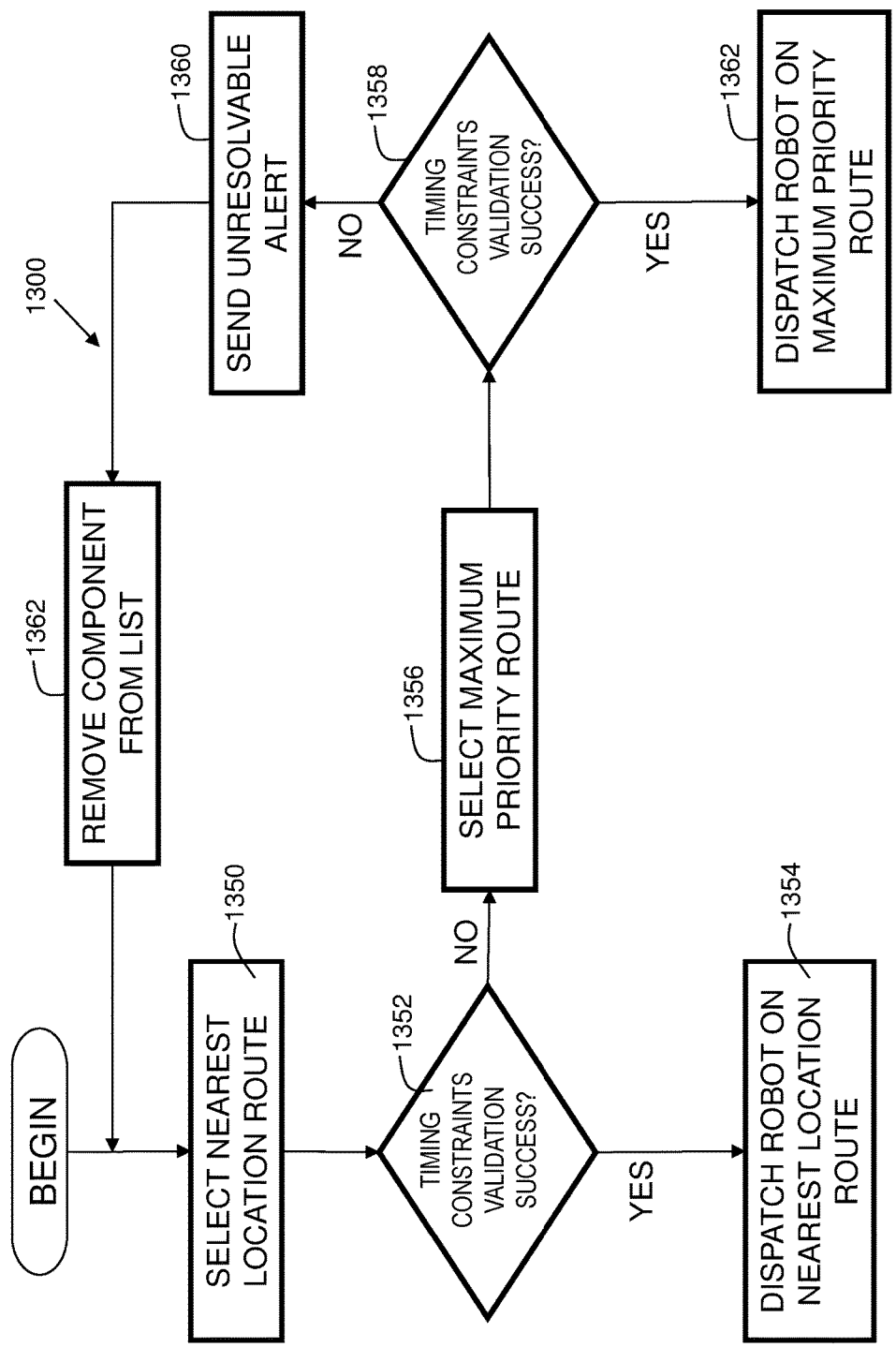

FIG. 13 is a flowchart indicating additional process steps for embodiments of the present invention.

The drawings are not necessarily to scale. The drawings are merely representations, not necessarily intended to portray specific parameters of the invention. The drawings are intended to depict only example embodiments of the invention, and therefore should not be considered as limiting in scope. In the drawings, like numbering may represent like elements. Furthermore, certain elements in some of the Figures may be omitted, or illustrated not-to-scale, for illustrative clarity.

DETAILED DESCRIPTION

Disclosed embodiments provide techniques for automated replacement of components in a datacenter. A robotic manipulator (referred to in short as "robot" herein) is instructed to follow a route to replace parts within a datacenter. In embodiments, a robot may receive routing instructions from a robot control server. The robot control server receives information regarding components that are scheduled for and/or requiring replacement (referred to as "failed components" herein). The robot control server then computes a route for a robot based on various factors such as current robot location, location of the parts that need to be removed, and/or location of the replacement parts. In this way, very large datacenters can improve operational efficiency and reduce costs by automating tasks such as replacement of blade style computer components.

Reference throughout this specification to "one embodiment," "an embodiment," "some embodiments", or similar language means that a particular feature, structure, or characteristic described in connection with the embodiment is included in at least one embodiment of the present invention. Thus, appearances of the phrases "in one embodiment," "in an embodiment," "in some embodiments", and similar language throughout this specification may, but do not necessarily, all refer to the same embodiment.

Moreover, the described features, structures, or characteristics of the invention may be combined in any suitable manner in one or more embodiments. It will be apparent to those skilled in the art that various modifications and variations can be made to the present invention without departing from the spirit and scope and purpose of the invention. Thus, it is intended that the present invention cover the modifications and variations of this invention provided they come within the scope of the appended claims and their equivalents. Reference will now be made in detail to the preferred embodiments of the invention.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", or "has" and/or "having", when used in this specification, specify the presence of stated features, regions, integers, steps, operations, elements, and/or components, but do not preclude the presence or addition of one or more other features, regions, or elements.

Figure 1:
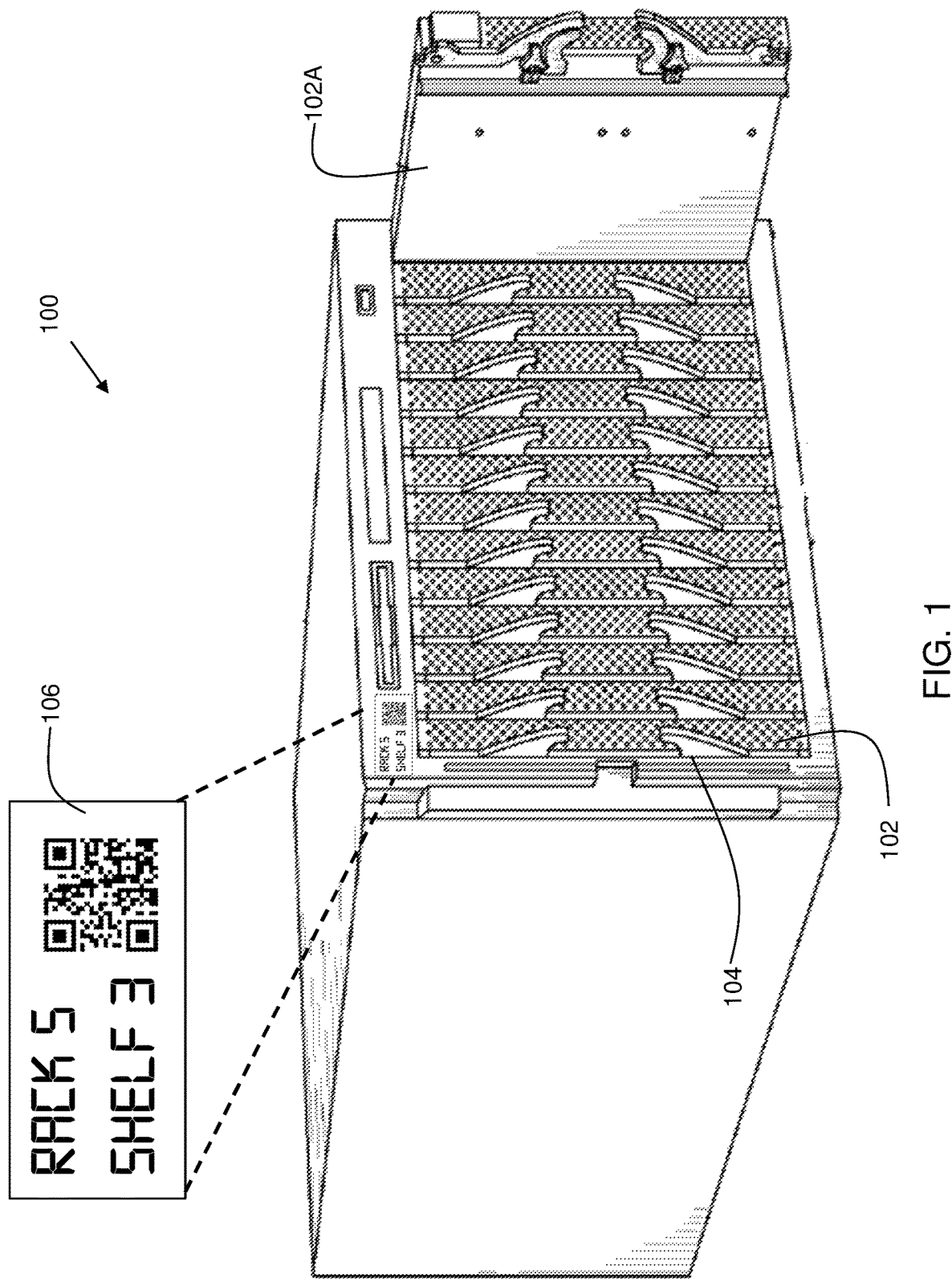
FIG. 1 shows an example of a shelf of components used in embodiments of the present invention.

FIG. 1 shows an example of a shelf 100 of components used in embodiments of the present invention. In implementations, a datacenter may have hundreds, or even thousands, of racks, where each rack contains one or more shelves. Each shelf 100 has several components (used interchangeably herein with "parts"), examples of which are pointed out by 102 and 102A. Each component has a handle, an example of which is pointed out at 104. In the figure, component 102A is shown partially removed from the shelf. The shelf has a location identifier which, in the example, is a label 106. The label 106 on the shelf in the example has a rack number, a shelf number, and a computer readable code that is indicative of the location of the shelf in the data center.

Figure 2:
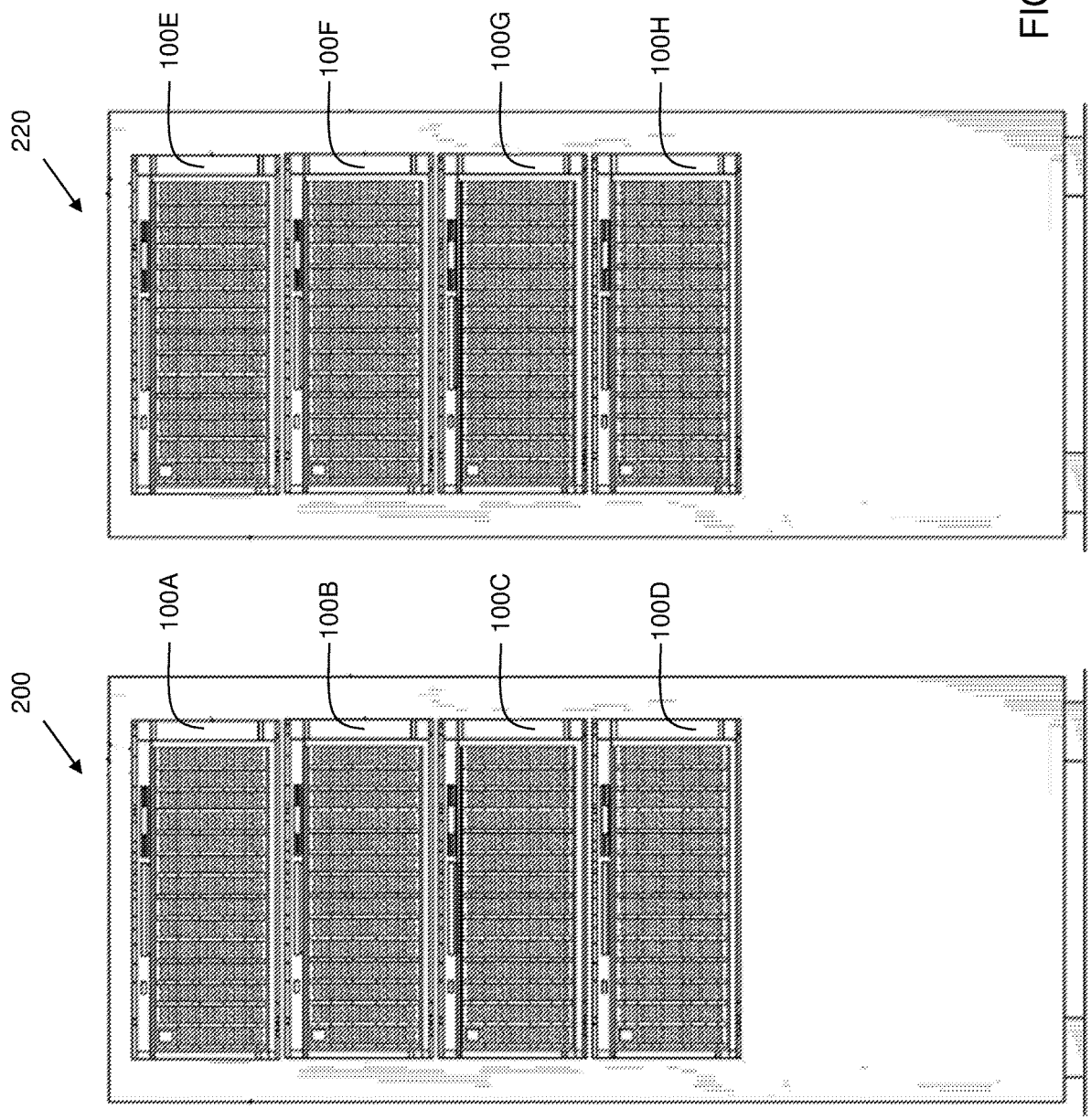
FIG. 2 shows examples of datacenter racks.

FIG. 2 shows example datacenter racks 200 and 220. Rack 200 has four shelves 100A, 1006, 100C, and 100D. Rack 220 also has four shelves 100E, 100F, 100G, and 100H. Each shelf has a plurality of components (not separately pointed out) therein.

Figure 3B:
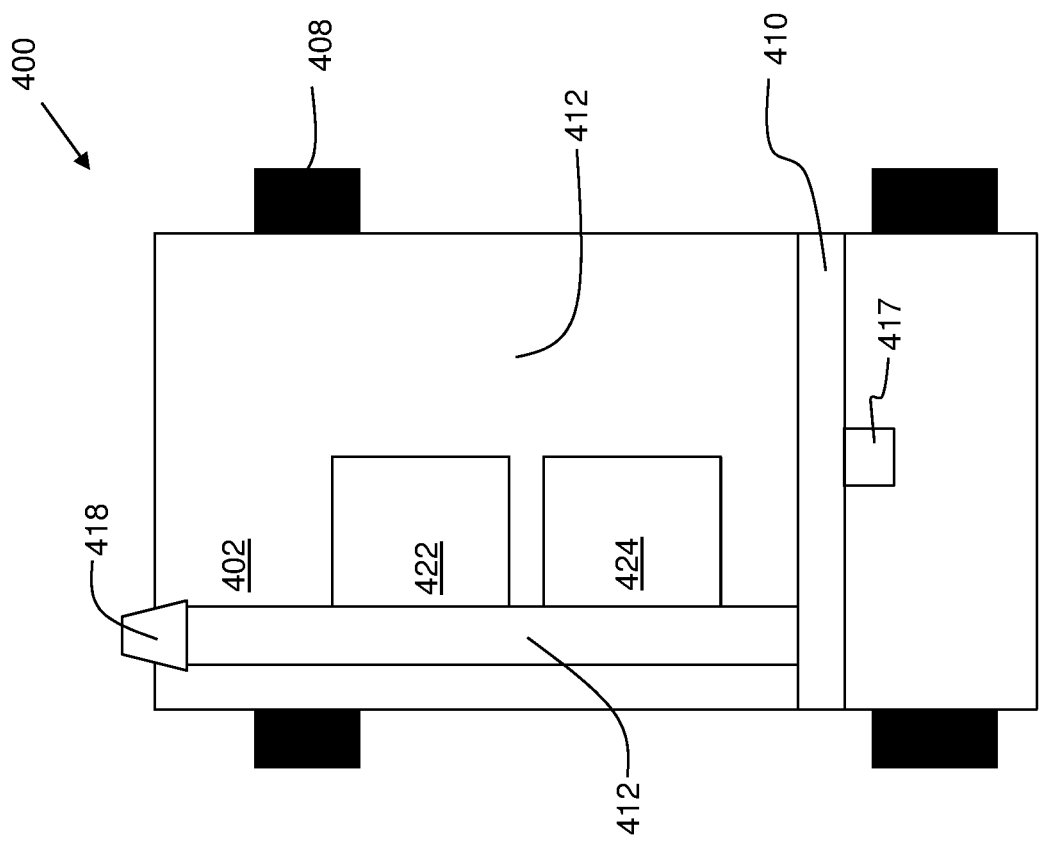
FIG. 3B shows a top-down view of the robot of FIG. 3A with a different gantry position.
Figure 3A:
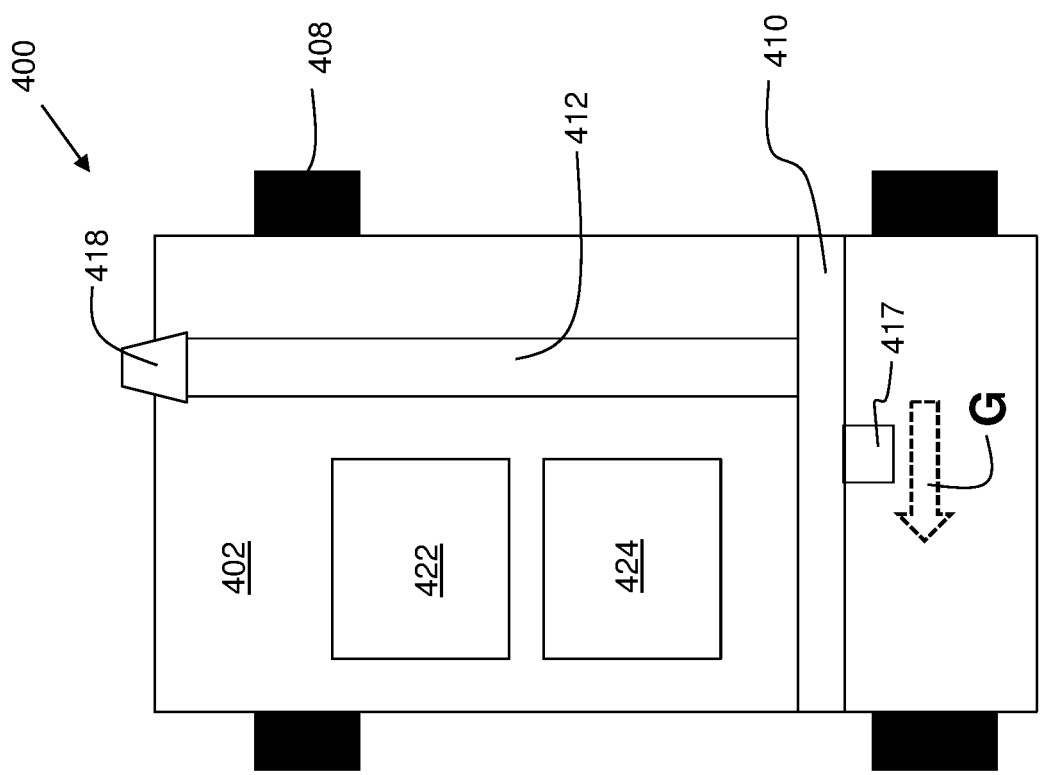
FIG. 3A shows a top-down view of a robot used in embodiments of the present invention.

FIG. 3A shows a top-down view of a robot 400 used in embodiments of the present invention. The robot 400 has a chassis 402 and four wheels, an example of which is pointed out at 408. The robot includes at least two bins. At 422, there is a failed components bin, and at 424, there is a replacement components bin. At 410, there is an X-gantry rail, at 412, there is a Y-gantry rail, and at 417, there is a Z-gantry rail. In this way, the X-gantry rail, Y-gantry rail, and Z-gantry rail form a gantry that can move in three dimensions. At 418, there is an optical module, which can include a camera, a laser scanner, an infrared scanner, and/or others.

FIG. 3B shows a top-down view of the robot 400 of FIG. 3A with a different gantry position. As shown, the gantry is now positioned above the left side of bins 422 and 424. Previously, in FIG. 3A, it was positioned to the right side of the bins. Accordingly, it moved along the X-gantry rail in direction G shown in FIG. 3A.

Figure 4A:
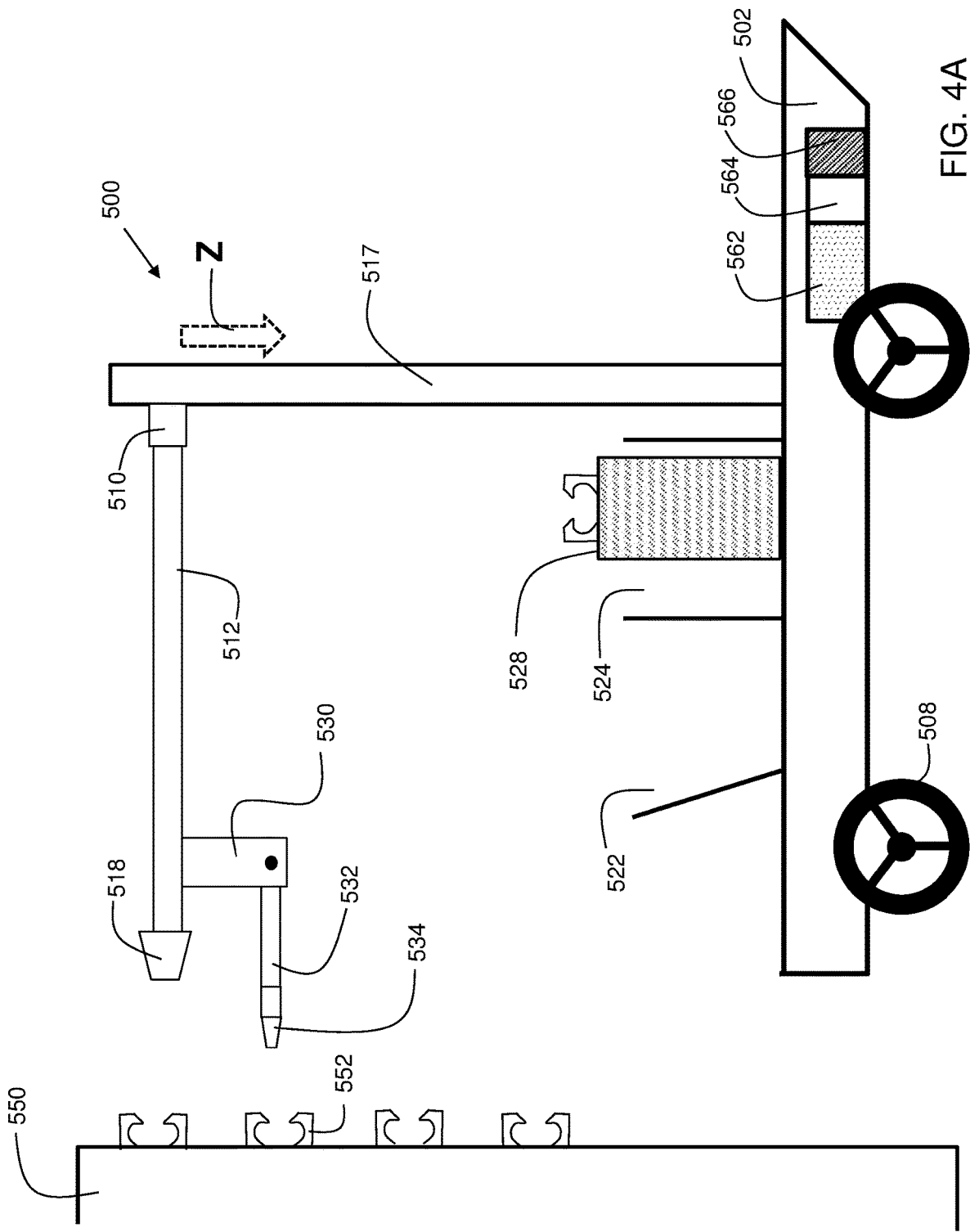
FIG. 4A shows a side view of a robot used in embodiments of the present invention, prior to removing a component from a datacenter rack.

FIG. 4A shows a side view of a robot 500 used in embodiments of the present invention, prior to removing a component from a datacenter rack. Robot 500 is similar to robot 400 of FIGS. 3A and 3B. Robot 500 has a chassis and wheels, an example of which is pointed out at 508. Robot 500 has a motor 562, battery 564, and a control unit 566. There are three rails, including the X gantry rail 510, the Y gantry rail 512, and the Z gantry rail 517. At 530, there is a gantry head, and at 532, a pivot rod. At the end of pivot rod 532 is component handler 534. At 518, there is an optical module. The optical module may include a camera, a laser scanner, an infrared scanner, and/or others. On the chassis 502, there is a failed components bin 522 and a replacement components bin 524. A datacenter rack (not part of the robot) is shown at 550 with a component pointed out at 552.

FIG. 4B shows a side view of a robot 500 used in embodiments of the present invention, in the process of removing a component from a datacenter rack. The component handler 534 is pushed in between the flanges of the handle of component 552. The component handler is pushed into position either by moving wheels 508 toward the rack, and/or moving gantry head 530 along Y-gantry rail 512 toward the rack. Robot 500 is shown in position to pull out the target component 552 from a shelf of the rack 550. Note that the target component may be faulty, or due for replacement. For example, a disk array may warrant replacement after 10,000 hours, even if it is still working. In another example, a network card may need replacement if there was an "overtemp" condition where the temperature was reported to exceed, for example, 140 degrees Celsius.

Figure 4C:
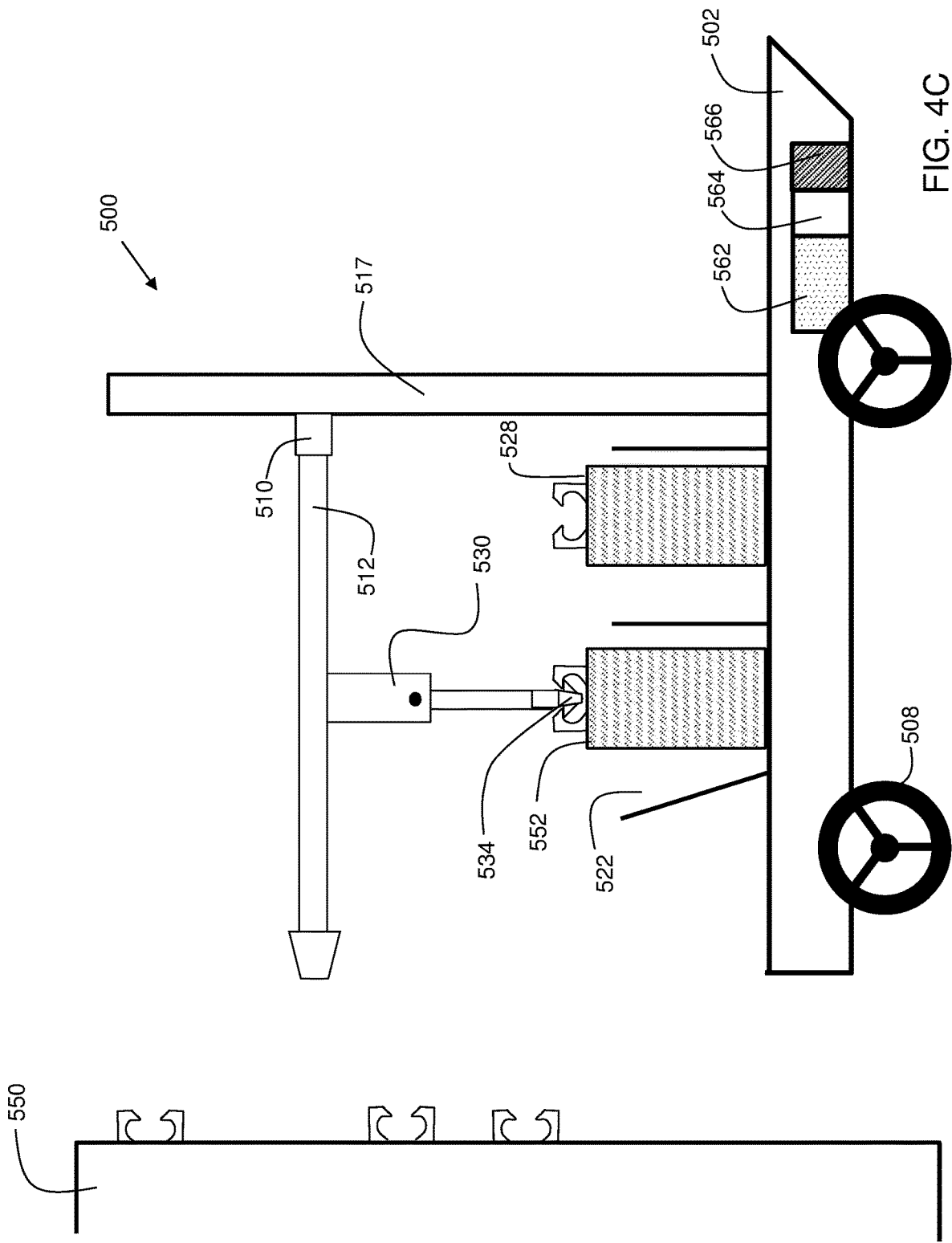
FIG. 4C shows a side view of a robot used in embodiments of the present invention, in the process of placing a removed component in a failed components bin.

FIG. 4C shows a side view of a robot 500 used in embodiments of the present invention, in the process of placing a removed component in a failed components bin 522. Gantry head 530, once it has grabbed the target component 552 from the rack via component handler 534, moves along applicable rails to position component 552 into failed components bin 522. For the sake of illustration, each shelf in FIG. 4C is assumed to have one component. In practice, each shelf may likely include multiple components, such as the shelf shown in FIG. 1.

Figure 4D:
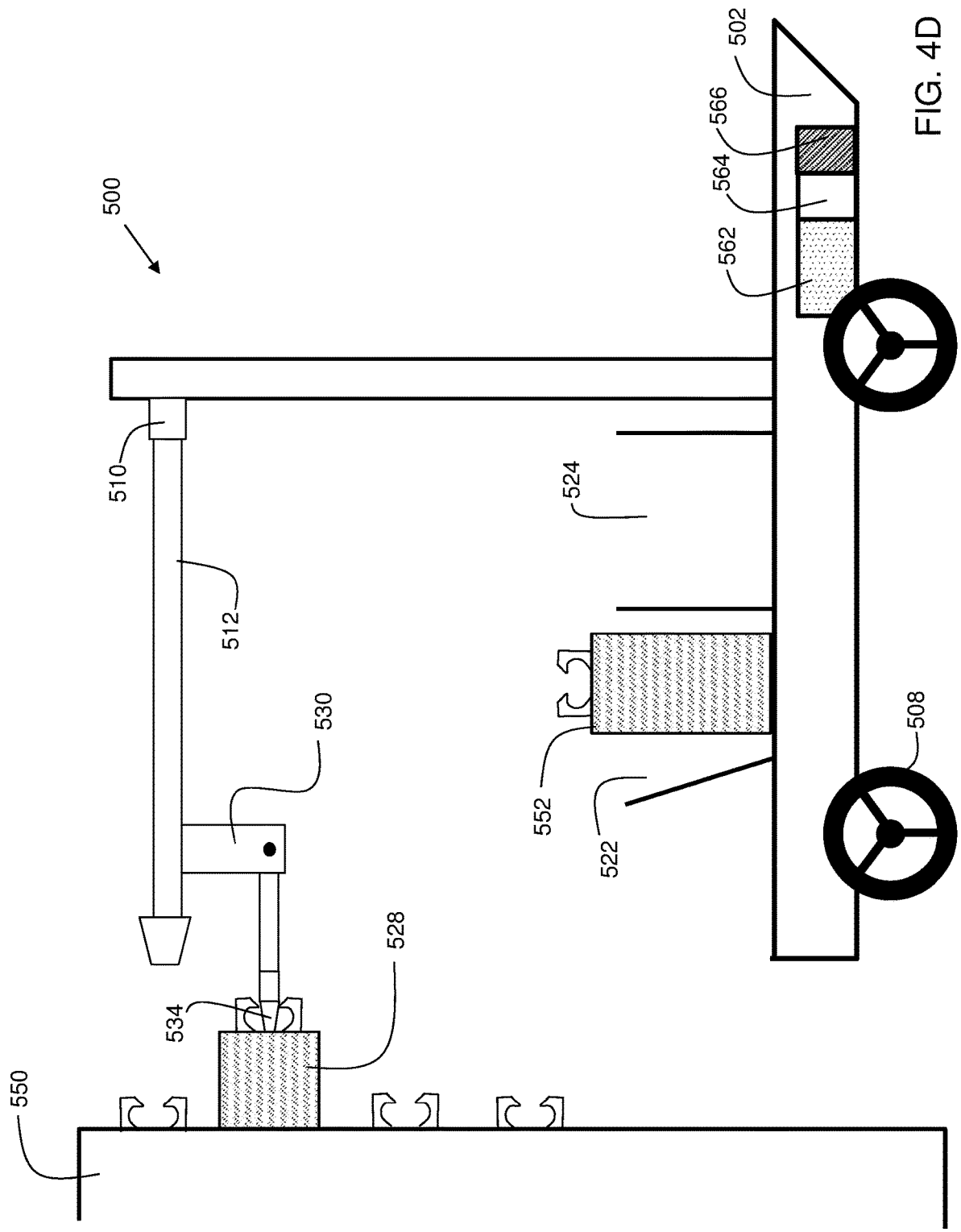
FIG. 4D shows a side view of a robot used in embodiments of the present invention, in the process of inserting a replacement component in a datacenter rack.

FIG. 4D shows a side view of a robot 500 used in embodiments of the present invention, in the process of inserting a replacement component in a datacenter rack. The robot 500 attaches component handler 534 into the handle of component 528 while the component is in replacement components bin 524. Robot 500, then, using motion of wheels 508 and/or gantry head 530 along Y-gantry rail 512, positions the component handler 534, having the component attached thereto, for insertion of replacement part 528 in the appropriate slot of the rack 550. The component handler 534 is shown in an install configuration to push in the component 528.

FIG. 4E shows a side view of a robot 500 used in embodiments of the present invention, after completely inserting a replacement component in a datacenter rack. Component 528 is now fully inserted into the slot (not shown) by moving gantry head 530 and/or wheels 508 accordingly. Component 528 is functionally equivalent to failed part 552 such that with component 528 installed, the computing devices within rack 550 are now functional again.

In some embodiments, the robot picks up the replacement part from a pick-up depot, and deposits failed parts (i.e., replaced parts) at a drop-off depot. In some embodiments, the capacity of bins 522 and 524 can hold multiple components, so the robot does not necessarily have to go to a depot after every swap. In some embodiments, for example, the bin 524 can hold 10 replacement components so the robot can make multiple replacements before needing to return to drop off failed components and/or pick up new replacement parts.

Figure 5:
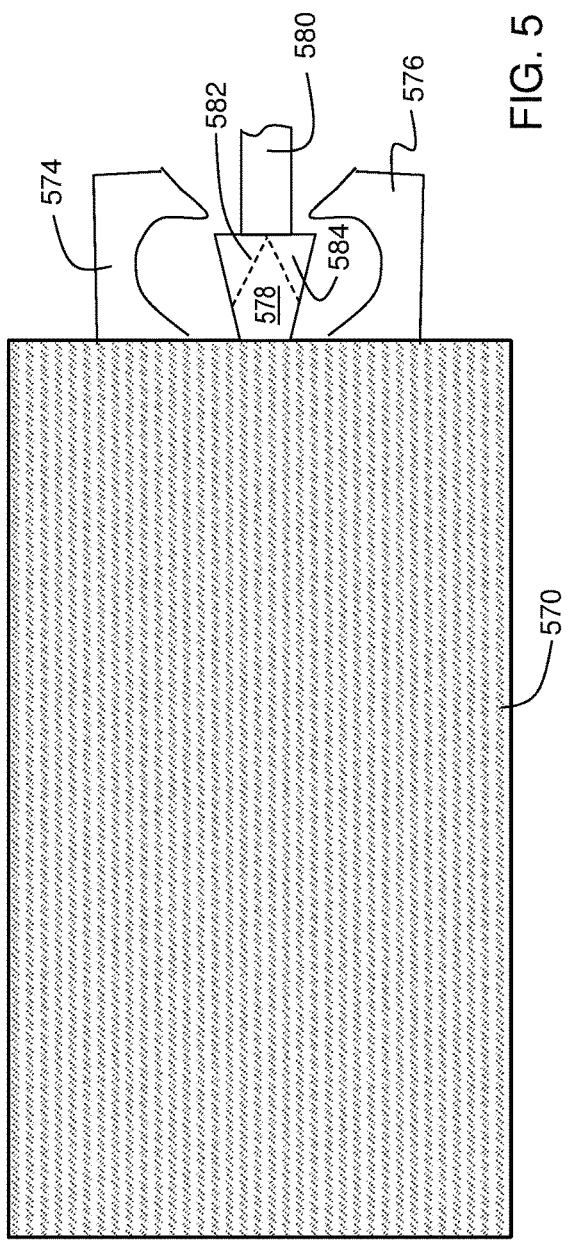
FIG. 5 shows details of a component handler with head flanges in a concealed position.

FIG. 5 shows details of a component handler with head flanges in a concealed position. Component 570 has a handle made up of two flanges—upper handle flange 574 and lower handle flange 576. The component handler has pivot rod portion 580 (like 532) with a component handler head 578 at the end thereof. Component head flanges are shown in concealed position within component handler head 578.

Figure 6:
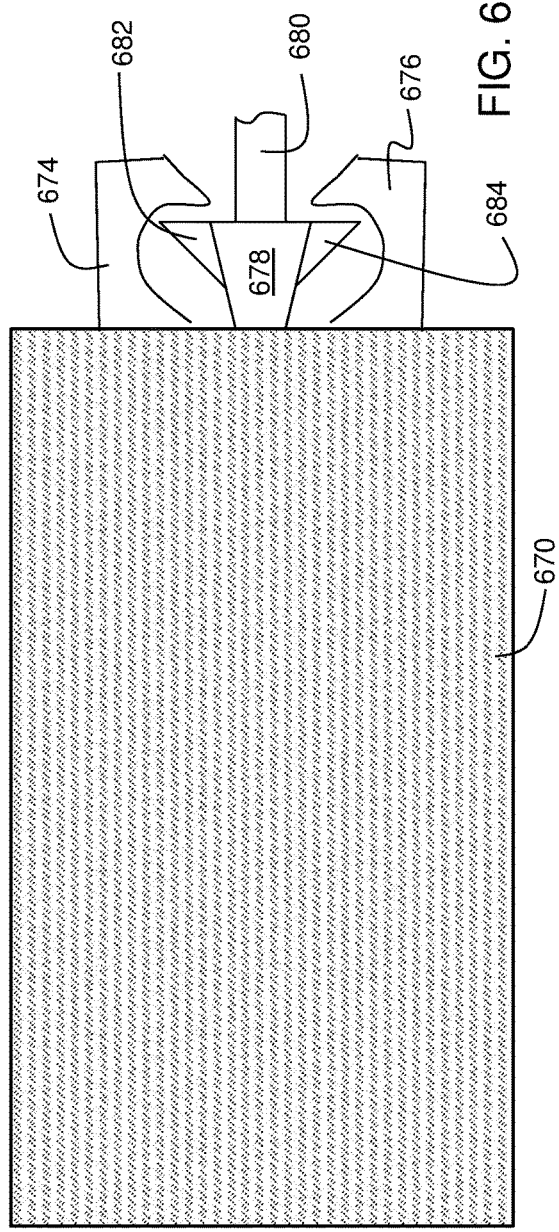
FIG. 6 shows details of a component handler with head flanges in an extended position.

FIG. 6 shows details of a component handler with head flanges in an extended position. Component 670 has a handle made up of two flanges—upper handle flange 674 and lower handle flange 676. The component handler has pivot rod portion 680 with a component handler head 678 at the end thereof. Component handler head flanges 682 and 684 are shown in extended position protruding from component handler head 678. This configuration is used to extract (pull out) parts from the rack. When the component handler head 678 is pulled away from the component 670, the component head flanges 682 and 684 mechanically engage with the handle flanges 674 and 684 to cause the component to be removed from its rack location as the component head is pulled away from the rack. In embodiments, the head flanges 682 and 684 can be extended by solenoids, pneumatically, or other suitable method.

It should be recognized that robots 400 and 500 are examples described for the purposes of disclosure. Embodiments are not limited to the configuration or operation of such robots. Any suitable robot configuration and operation is included within the scope of the invention. In addition, the gripping configurations as shown in FIGS. 4A-6 are non-limiting examples as well. Any suitable grip configuration and methods are included within the scope of the invention.

FIG. 7A shows an example datacenter 700 with multiple racks and multiple robots. Datacenter has part pickup depots 718 and 720, and failed part drop-off depots 716 and 722. In some embodiments, more or fewer drop-off and pick-up depots may be included. In addition, in some embodiments, the drop-off and pick-up depots may be combined as a single entity. Datacenter 700 has racks 702, 704, 706, 708, 712, and 714 with shelves thereon (not shown), and robots 740, 742, 744, 746 servicing the racks. A robot control server 826 receives failure reports from servers (e.g., thru SNMP, TR069, or other suitable protocol) on the shelves. The control server 826 communicates routes/instructions to the robot(s) as maintenance records based on failure report information that can change dynamically. Server 826 is substantially continuously evaluating where the robots need to be first and next, if they have the necessary replacement parts on board, if their failed bins have additional room for more failed parts, and other factors as needed. A subset of the plurality of computer components for replacement are selected based on predicted failure time. A route is created that visits the one or more racks containing the subset of the plurality of computer components.

In some embodiments, server 826 computes travel paths for one or more robots as follows. A solution interval is partitioned in time intervals, and the solution is computed and updated for each interval. In these embodiments, for each time interval, the racks are sorted based on their time limits. The solution domain is partitioned into "n" sets of racks, with each set having "m" number of racks where each "m" is the number of vehicles operating at any time interval. The first set has the "m" racks with the strictest time limits, the second set has the next "m" in the sorted list, and so on and so forth. Each of these sets are then distributed to the "m" operating robot vehicles based on their proximity to the racks. The server 826 then computes a route for each robot vehicle based on the components assigned to it for replacement.

The travel path for one or more robots can be developed based on nearest location to the robot, maximum priority of the components needing replacement, or maximum priority route with an added replacement candidate. In some embodiments, a single robot is used. In some embodiments, multiple robots handle different regions of a datacenter. In yet other embodiments, dedicated robots handle roles of replacement and insertion.

In some embodiments, multiple wireless transmitters 772, 774, and 776 are positioned within the datacenter 700. The wireless transmitters may be RF beacons, WIFI transmitters, Bluetooth® transmitters, or other suitable protocol. A robot makes a location assessment within the venue by use of the wireless transmitters. The location assessment may be accomplished by triangulation, beacon proximity, or other suitable location determination technique. In some embodiments, triangulation may occur using transmitters that are located outside of the datacenter. For example, in some embodiments, triangulation may occur using local radio station transmitters that are within range of the datacenter, such as local FM or AM radio stations. Embodiments may include assessing signal strength and additionally performing a station identification using frequency and/or an SSID (service set identifier) or other identifier to make a location assessment. In some embodiments, an inertial navigation system may be used to determine location within the datacenter. In some embodiments, an optical system may be used to determine location within the datacenter. Thus, in some embodiments, a location assessment may be made without the use of transmitters.

FIG. 7B shows an example travel path for a single robot embodiment in a datacenter 700. The travel path shown is a nearest location route. In embodiments utilizing a nearest location route, the robot is sent to the nearest location where component replacement is required. Once that replacement is complete, the robot is sent to the nearest location from its then current location, and so on. In the example shown, components need replacement at location L1 at rack 702, location L2 at rack 706, and location L3 at rack 714. Server 826 creates a travel route for robot 746 which includes a first stop at L1, then to a pick-up depot, followed by L2, L3, and finally, a drop-off depot. Server 826 sends the travel route in a maintenance record to robot 746. Accordingly, robot 746, with a replacement component on board, is directed to location L1 to replace a component on rack 702 since that location is nearest the robot's initial location. From L1, the robot 746 is directed to the pick-up depot 718 to pick up replacement components for racks 706 and 714. The robot is then directed to L2 to replace a part on rack 706, which is nearest the pick-up depot. From L2, the robot is directed to L3 to replace a part on rack 714 since such location is nearest L2. Finally, the robot is directed to drop off depot 722 to drop off failed components from racks 702, 706, and 714. Thus, in embodiments, creating a route comprises creating a nearest location route.

FIG. 7C shows an example of a maximum priority route. In some embodiments, creating a route comprises creating a maximum priority route. The route sends the robot to replace failed components in the order of their priority. Components having a higher priority get replacement first. In the example, failed components need replacement at location L1 on rack 702, location L2 on rack 706, and location L3 on rack 714. Priority may be set by an administrator, user, or calculated by server 826 based on factors such as number of compute jobs executing on the rack, current redundancy available for the rack (how many other racks are available to take over compute job execution if that rack is taken offline), and/or other factors. An example formula for calculating priority (P) is:

$$P = E - C$$

Where:
E=Number of compute jobs executing on the rack
C=Current redundancy available for the rack (how many other racks are available to take over compute job execution if that rack is taken offline)

In the example, the higher the value of P, the greater the priority. Accordingly, a first server which is computing 100 jobs, and there are 20 other redundant servers, would have a P of 80. A second server which is computing 50 jobs, and there are 10 other redundant servers, would have a P of 40. Therefore, in this example, a component needing replacement on the first server would have a greater priority than the component on the second server. This is an example formula, and any suitable calculation of priority is included within the scope of the invention.

Server 826 determines that the failed component at L2 is ranked with highest priority, followed by the component at L1, and the component at L3 having lowest priority. Accordingly, server 826 creates a travel route here, and sends it in a maintenance record to robot 746. According to the route, robot 746 is directed, with a component replacement part on board to L2 (even though L2 is not as close to the robot's current location as L1). Robot 746 is then directed to stop at pick-up depot 718 for replacement components for L1 and L3, and then to stop at drop-off depot to drop off the failed component from L2. The robot 746 is then directed to L1 followed by L3 for component replacement.

FIG. 7D shows an example of a maximum priority route with an added replacement candidate. Some embodiments include identifying a replacement candidate on the maximum priority route. Then a time constraint is checked for the maximum priority route with a replacement candidate added. Finally, the replacement candidate is added to the maximum priority route in response to the time constraint being met.

In the example shown in FIG. 7D, components need replacement at location L2 at rack 706, location L3 at rack 714, and location L4 at rack 704. Location L2 has the most criticality, so it has highest priority for component replacement. Server 826 has determined that the component at L2 must be replaced within time T1. Accordingly, robot 746 has to start moving in that direction right away. However, server 826 computes that based on the time budget (T1) for replacement of the component at L2, the robot has time to stop at L4 and replace the component there along the way, and still be at L2 in time within T1. Therefore, L4 is a replacement candidate. Server 826 sends robot 746 a travel route, which directs the robot to L4, followed by L2, then to pick-up depot 718, and then on to handle a low priority replacement at L3.

FIG. 7E shows an example of multiple robots handling different regions of a datacenter. Some embodiments include selecting a second subset of the plurality of computer components for replacement based on the predicted failure time. A second route is created that visits the one or more racks containing the plurality of computer components. The second route is sent to a second maintenance robot. A second maintenance record is sent corresponding to the second subset of the plurality of computer components for replacement to the second maintenance robot. The second maintenance robot is then dispatched to travel the second route and replace the second subset of the plurality of computer components for replacement.

In the example, components need replacement at location L1 on rack 702, L2 on rack 706, location L3 on rack 714, location L4 on rack 704, and L5 also on rack 704. There are two robots servicing the datacenter—robot 746 and robot 748. Server 826 determines based on time constraints, and distribution of the replacement locations, that robot 746 should handle the replacements at L1 and L5. Robot 746 is already in the row where such replacement locations are also situated. Server 826 determines based on the time constraints, and the distribution, that robot 748 should handle the replacements at L3, L4, and L2. Robot 746 is already in the row of stacks where such replacement locations are also situated.

Accordingly, in some embodiments that include a multiplicity of robots, particular robots can be relegated to dispatch to specific regions of a datacenter 700. In other embodiments, all robots may have free reign to be dispatched anywhere in the datacenter. In such cases, the server may dispatch the robot that is closest to service a location, or may query the robots to "ask" which robot is closest to a given location.

FIG. 7F shows an example of dedicated robots handling roles of replacement and insertion. Some embodiments include instructing the maintenance robot to remove the subset of the plurality of computer components. A second maintenance robot is then instructed to install a new instance of each of the subset of the plurality of computer components. Accordingly, in some embodiments, there are robots dedicated to part removal roles and other robots dedicated to part insertion roles. The robot that does insertions has to insert after the removal robot removes. In the example, robot 746 is assigned a removal role, and robot 748 is assigned a replacement role. Therefore, robot 746 is sent a travel route that directs it to location L1 and removes a component, then on to L5 and removes a component, and puts those parts into drop-off depot 716. Insertion robot 748 is sent a travel route that directs it to pick up new parts from depot 718 and then insert a component in location L5 and location L1.

FIG. 8 shows an environment for embodiments of the present invention. A robot control server 826 includes a processor 840, memory 842, and storage 844. The processor 840 is coupled to the memory 842 such that it can access instructions 847 stored in memory 842. The processor 840 executes the instructions 847, stored in memory 842, in implementation of embodiments of the present invention. Memory 842 may include dynamic random-access memory (DRAM), static random-access memory (SRAM), magnetic storage, and/or a read only memory such as flash, EEPROM, optical storage, or other suitable memory. In some embodiments, the memory 842 may not be a transitory signal per se. The storage 844 may include one or more hard disks, or other suitable storage technology. Server 826 is an electronic computing device. Note that while one such device is illustrated in diagram 800, in practice, there may be multiple electronic computing devices similar to server 826 operating in a distributed manner for load balancing and data redundancy.

The robot control server 826 is connected to a network 824. Network 824 is the Internet, a wide area network, a local area network, or any other suitable network. Robots 872 and 874 are each in communication with server 826 via network 824. In embodiments, network 824 is a local area wireless network. In embodiments, robots 872 and 874 receive route instructions from robot control server 826.

An inventory system 856 is also connected to network 824. System 856 is a storage device that may include a database that stores component inventory data. This includes, for example, component numbers, rack numbers on which parts are located, number of components available at a pick-up depot for replacing current parts, etc.

A server monitoring system 858 is also connected to network 824. Server monitoring system 858 is a computing device that monitors the functioning of the racks 892 and 894 of servers. It may monitor for errors on the servers, changes in processing load of the servers, humidity in the room, temperature of the room (as humidity and temperature can affect performance), etc. which may indicate a need for component replacement.

Each of the devices connected to the network 824 includes a communications interface such as Bluetooth, Wi-Fi, or other suitable system to implement communication over the network.

FIG. 9 is a block diagram for a robot 900 in accordance with embodiments of the present invention. Robot 900 includes a processor 902, which is coupled to a memory 904. Memory 904 may include dynamic random-access memory (DRAM), static random-access memory (SRAM), magnetic storage, and/or a read only memory such as flash, EEPROM, optical storage, or other suitable memory. In some embodiments, the memory 904 may not be a transitory signal per se. In embodiments, robot 900 may have multiple processors 902, and/or multiple cores per processor. The robot 900 may execute an operating system that provides virtual memory management for the robot 900. The processor 902 may have one or more cache memories therein.

Robot 900 further includes a camera 906. This may be an optical camera, infrared, or other suitable device for sensing objects in the environment.

Robot 900 includes a scanner 908. This can include a laser, such as a barcode or QR code scanner, and/or an RFID reader.

Robot 900 further includes geolocation receiver 910. This may include a global positioning system (GPS), GLONASS, Galileo, or other suitable system for directing and moving the robot in the appropriate directions.

Robot 900 further includes a communication interface 912. The communication interface 912 may be a wired communication interface that includes Ethernet, Gigabit Ethernet, or the like. In embodiments, the communication interface 912 may include a wireless communication interface that includes modulators, demodulators, and antennas for a variety of wireless protocols including, but not limited to, radio, Bluetooth™, Wi-Fi, and/or cellular communication protocols for communication over a computer network. The communication interface 912 may interface with beacons of an indoor positioning system (IPS) (e.g., 772, 774, and 776 of FIG. 7A).

The robot 900 further includes several other items. Thermometer 913 may be used to obtain an ambient temperature of the datacenter. Articulator control 914 controls gantry functions. Accelerometer 916 assists in navigation. Steering control 918 steers the robot. Motor control 920 controls the robot motor(s) that drive the wheels of the robot.

Robot 900 further includes inventory control module 922. This includes sensors and/or other devices for keeping track of new parts onboard the robot and/or capacity available in the failed parts bin. This can include scales, contact sensors, optical sensors, and/or other suitable devices.

FIG. 10 is a flowchart 1000 indicating process steps for an embodiment of the present invention. At 1050, a failure rate is predicted. In some embodiments, predicting a failure rate is based on historical data, such as repair statistics provided by a manufacturer, and/or observed failure rates over a period of time. In some embodiments, the ambient temperature and/or humidity within the datacenter is used to compensate (adjust) the failure rates. Thus, embodiments can include compensating the predicted failure rate based on average ambient temperature. In embodiments, the ambient temperature may be obtained from a digital thermometer onboard the robot, and/or a digital thermometer with telemetry functions that is installed within the datacenter. Embodiments can also include compensating the predicted failure rate based on usage. This can include number of hours used, number of start-stop cycles, and/or other criteria.

At 1052, a failure time is predicted based on the predicted failure rate. For example, if the failure rate for a component is after 10,000 hours (end of life), and the last replacement of the component was 5,500 hours ago, then the predicted failure time is 4,500 hours from present.

At 1054, components for replacement are selected based on the predicted failure time. A plurality of components that is due, or will be due, at a particular time for replacement are determined.

At 1056, a route is created for one or more robots that visits the one or more racks containing the plurality of components. The route is created based on a variety of factors, such as predicted failure rates of components, currently failed components, current robot location, location of the replacement parts, and other suitable parameters.

At 1058, a maintenance record is sent to a robot. The maintenance record corresponds to the subset of the plurality of computer components for replacement by the robot.

At 1060, the maintenance robot is dispatched to travel the route. The route may be dynamically recreated as conditions in the datacenter change. So, elements of this process repeat in some embodiments based on changes detected.

Embodiments may include predicting a failure rate for a plurality of computer components within a datacenter, wherein the computer components are installed within one or more racks within the datacenter; predicting a failure time for the plurality of computer components based on the corresponding failure rate; selecting a subset of the plurality of computer components for replacement based on the predicted failure time; creating a route that visits the one or more racks containing the subset of the plurality of computer components; sending the route to a maintenance robot; sending a maintenance record corresponding to the subset of the plurality of computer components for replacement to the maintenance robot; and dispatching the maintenance robot to travel the route. Embodiments may further include instructing the maintenance robot to replace the subset of the plurality of computer components.

FIG. 11 is a flowchart 1100 indicating process steps for an additional embodiment of the present invention. At 1150, a failed component is identified. The component is malfunctioning or has reached the end of its life.

At 1152, a location of the failed part is determined. This may be based on information stored in an inventory system, such as 856 of FIG. 8.

At 1154, a replacement component is picked up by a robot. It may be placed in a replacement parts bin on board the robot. The replacement component may be acquired from a pick-up depot where replacement components are stored.

At 1156, the robot steers, with the replacement component, to the location of the failed part. At 1158, the failed component is removed from its shelf using the hotswap protocol for the component. At 1160, the failed component is placed in a failed parts bin on board the robot. At 1162, a replacement component is inserted into the shelf using the hotswap protocol corresponding to the part being replaced. At 1154, the failed component is dropped off by the robot at a failed part depot.

FIG. 12 is an example data structure 1200 for embodiments of the present invention. In embodiments, the data structure 1200 can be stored in a server (e.g., server 826 (FIG. 8). The data structure may be any type of database, such as relational, hierarchical, etc. In the example, the database has several columns and rows. Row 1222 includes the title for the types of data in each column.

In the cells of column 1202, there are location points of components. The location points are denoted in form, RXSYPZ, where RX is rack X, SY is shelf Y, and PZ is position Z within the shelf. An example location in row 1224 reads R3S1P3, which is short for "Rack 3 shelf 1, position 3 within shelf 1."

In the cells of column 1204, there are component numbers. For example, in row 1224, there is a component identified as FX-5C at location R3S1P3. In row 1226, there is a component identified as THX-1 at location R21S3P7.

In the rows of column 1206, there is the distance (e.g., in meters, inches, feet, etc.) between the location of the component and the current position of the robot. For example, in row 1228, there is a distance of 52 meters between the robot's current location and the component identified as C3P-0 at location R34S2P5. In row 1230, there is a distance of 352 meters between the robot's current location and the part identified as FX-5C at location R528S2P1.

In the cells of column 1208, there is a measure of the estimated time for the robot to get to the component's location from the robot's current position. The estimation is based on distance, average robot speed, etc. For example, in row 1232, it is estimated that 4 minutes, 7 seconds is needed for the robot to get 75 meters to location R5S2P8 where the component identified as STRNS is situated.

In the cells of column 1212, there are flags for whether a part of the desired type is currently on board the robot (e.g., in bin 524). In rows 1224, 1226, and 1228, the flag is yes, whereas in rows 1230 and 1232, the flag is no.

In the cells of column 1214, there is a time window corresponding to the amount of time in which the identified component must be replaced. In row 1226, it is indicated that in 18 minutes, the component identified as THX-1 must be replaced. In row 1228, it is indicated that in 4 minutes, the component identified as R34S2P5 must be replaced.

In the cells of column 1216, there is a hotswap protocol setting. The hotswap protocol (HSP) describes what conditions are required to remove/insert a component. In some cases, the hotswap protocol may be set to "ON", indicating that the component may be replaced while the rack is powered on and fully operational. In some cases, the hotswap protocol may be set to "STBY", indicating that the component may be replaced while the rack is powered but in a standby mode. In some cases, the hotswap protocol may be set to "OFF", indicating that the component may be replaced while the rack is fully powered off. In embodiments, the robot may initiate a change in operating state (e.g., from ON to STBY, or await an indication from the server monitoring system 858 that the rack has successfully transitioned to the state consistent with the hotswap protocol needed for part replacement.

In the cells of column 1218, a priority is assigned to the replacement of the component. This is an optional step in addition to computing the time window of column 1214. The priority may be based on the importance of the component to the functioning of the machine/server in which it is located, or the importance of the data (as indicated by an administrator, user, or owner of the data, etc.), on the machine in which it is located. The time window and priority, if assigned, can be used to determine the order in which failed components should be replaced. For example, the component identified as C3P-0 could be ranked first since it is of highest priority (1), and must be replaced in the shortest time frame (4 minutes), as shown in row 1228.

FIG. 13 is a flowchart 1300 indicating additional process steps for embodiments of the present invention. At 1350, the nearest location route is selected. This means that replacement of the failed component nearest the robot's current location will be replaced first, followed by the failed component nearest the robot at that point, etc.

At 1352, it is determined whether timing constraints validation succeeds using a nearest location route. The timing constraints validation succeeds if it is determined that each component needing replacement can be replaced before its time window (column 1214 of FIG. 12) expires. If yes, at 1354, the robot is dispatched on the nearest location route.

If no at 1352, a maximum priority route is selected at 1356. The robot will replace a failed component that is most critical (shortest time window) first, followed by the next most critical, etc. The process proceeds to 1358. At 1358, it is determined whether timing constraints validation succeeds using a maximum priority route. The timing constraints validation succeeds if it is determined that each component needing replacement can be replaced before its time window (column 1214 of FIG. 12) expires. If yes, then at 1362, the robot is dispatched on the maximum priority route. If no, then at 1360, an unresolvable alert is sent, and at 1362, the component that needs to be replaced is removed from the list. By removing that component from the list, it is no longer being considered for robotic replacement, and can be replaced manually by maintenance/administrator personnel that get notified by the unresolvable alert sent at step 1360.

Embodiments can include checking timing constraints of the maximum priority route based on a time window for a plurality of components within a datacenter; checking a nearest location route for timing constraints based on each time window; and in response to a timing constraint validation failure, sending an unresolvable alert message.

As can now be appreciated, disclosed embodiments provide techniques for automated replacement of components in a datacenter. Using robots to preemptively replace parts based on dynamic failure conditions enables a datacenter to provide a higher level of uptime and reduces labor costs by automating the routine task of replacing components. Additionally, the chance for human error is reduced since the robots can verify component and location information prior to part replacement. Thus, disclosed embodiments improve the technical field of datacenter operation.

Some of the functional components described in this specification have been labeled as systems or units in order to more particularly emphasize their implementation independence. For example, a system or unit may be implemented as a hardware circuit comprising custom VLSI circuits or gate arrays, off-the-shelf semiconductors such as logic chips, transistors, or other discrete components. A system or unit may also be implemented in programmable hardware devices such as field programmable gate arrays, programmable array logic, programmable logic devices, or the like. A system or unit may also be implemented in software for execution by various types of processors. A system or unit or component of executable code may, for instance, comprise one or more physical or logical blocks of computer instructions, which may, for instance, be organized as an object, procedure, or function. Nevertheless, the executables of an identified system or unit need not be physically located together, but may comprise disparate instructions stored in different locations which, when joined logically together, comprise the system or unit and achieve the stated purpose for the system or unit.

Further, a system or unit of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices and disparate memory devices.

Furthermore, systems/units may also be implemented as a combination of software and one or more hardware devices. For instance, location determination and alert message and/or coupon rendering may be embodied in the combination of a software executable code stored on a memory medium (e.g., memory storage device). In a further example, a system or unit may be the combination of a processor that operates on a set of operational data.

As noted above, some of the embodiments may be embodied in hardware. The hardware may be referenced as a hardware element. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor devices, chips, microchips, chip sets, and so forth. However, the embodiments are not limited in this context.

Also noted above, some embodiments may be embodied in software. The software may be referenced as a software element. In general, a software element may refer to any software structures arranged to perform certain operations. In one embodiment, for example, the software elements may include program instructions and/or data adapted for execution by a hardware element, such as a processor. Program instructions may include an organized list of commands comprising words, values, or symbols arranged in a predetermined syntax that, when executed, may cause a processor to perform a corresponding set of operations.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, may be non-transitory, and thus is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Program data may also be received via the network adapter or network interface.

Computer readable program instructions for carrying out operations of embodiments of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of embodiments of the present invention.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

While the disclosure outlines exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with embodiments of the present invention. Furthermore, the methods according to embodiments of the present invention may be implemented in association with the formation and/or processing of structures illustrated and described herein as well as in association with other structures not illustrated. Moreover, in particular regard to the various functions performed by the above described components (assemblies, devices, circuits, etc.), the terms used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of embodiments of the invention may have been disclosed with respect to only one of several embodiments, such feature may be combined with one or more features of the other embodiments as may be desired and advantageous for any given or particular application. Therefore, it is to be understood that the appended claims are intended to cover all such modifications and changes that fall within the true spirit of embodiments of the invention.

What is claimed is:

1. A computer-implemented method for performing maintenance in a datacenter, comprising:
    predicting a failure rate for a plurality of computer components within a datacenter, wherein the plurality of computer components is installed within one or more racks within the datacenter;
    predicting a failure time for the plurality of computer components based on the corresponding predicted failure rate;
    selecting a subset of the plurality of computer components for replacement based on the predicted failure time;
    creating a route that that is a maximum priority route that visits the one or more racks containing the subset of the plurality of computer components;
    sending the route to a maintenance robot;
    sending a maintenance record corresponding to the subset of the plurality of computer components for replacement to the maintenance robot;
    dispatching the maintenance robot to travel the route;
    identifying a replacement candidate on the maximum priority route;
    checking a time constraint for the maximum priority route with a replacement candidate added; and
    adding the replacement candidate to the maximum priority route in response to the time constraint being met.

2. The method of claim 1, wherein predicting a failure rate is based on historical data.

3. The method of claim 2, further comprising compensating the predicted failure rate based on average ambient temperature.

4. The method of claim 2, further comprising compensating the predicted failure rate based on usage.

5. The method of claim 1, wherein creating a route comprises creating a nearest location route.

6. The method of claim 1, further comprising instructing the maintenance robot to replace the subset of the plurality of computer components.

7. The method of claim 1, further comprising:
selecting a second subset of the plurality of computer components for replacement based on the predicted failure time;
creating a second route that visits the one or more racks containing the plurality of computer components;
sending the second route to a second maintenance robot;
sending a second maintenance record corresponding to the second subset of the plurality of computer components for replacement to the second maintenance robot; and
dispatching the second maintenance robot to travel the second route and replace the second subset of the plurality of computer components for replacement.

8. The method of claim 1, further comprising;
instructing the maintenance robot to remove the subset of the plurality of computer components; and
instructing a second maintenance robot to install a new instance of each of the subset of the plurality of computer components.

9. An electronic computing device comprising:
a processor;
a memory coupled to the processor, the memory containing instructions, that when executed by the processor, perform the steps of:
predicting a failure rate for a plurality of computer components within a datacenter, wherein the plurality of computer components is installed within one or more racks within the datacenter;
predicting a failure time for the plurality of computer components based on the corresponding predicted failure rate;
selecting a subset of the plurality of computer components for replacement based on the predicted failure time;
creating a route that that is a maximum priority route that visits the one or more racks containing the subset of the plurality of computer components;
sending the route to a maintenance robot;
sending a maintenance record corresponding to the subset of the plurality of computer components for replacement to the maintenance robot;
dispatching the maintenance robot to travel the route;
identifying a replacement candidate on the maximum priority route;
checking a time constraint for the maximum priority route with a replacement candidate added; and
adding the replacement candidate to the maximum priority route in response to the time constraint being met.

10. The electronic computing device of claim 9, wherein the memory further comprises instructions, that when executed by the processor, perform the step of predicting a failure rate based on historical data.

11. The electronic computing device of claim 10, wherein the memory further comprises instructions, that when executed by the processor, perform the step of compensating the predicted failure rate based on usage or average ambient temperature.

12. The electronic computing device of claim 9, wherein the memory further comprises instructions, that when executed by the processor, perform the step of creating a nearest location route.

13. The electronic computing device of claim 9, wherein the memory further comprises instructions, that when executed by the processor, perform the step of creating a maximum priority route.

14. The electronic computing device of claim 13, wherein the memory further comprises instructions, that when executed by the processor, perform the steps of:
identifying a replacement candidate on the maximum priority route;
checking a time constraint for the maximum priority route with a replacement candidate added; and
adding the replacement candidate to the maximum priority route in response to the time constraint being met.

15. The electronic computing device of claim 13, wherein the memory further comprises instructions, that when executed by the processor, perform the steps of:
checking timing constraints of the maximum priority route based on a time window for a plurality of components within a datacenter;
checking a nearest location route for timing constraints based on each time window; and
in response to a timing constraint validation failure, sending an unresolvable alert message.

16. The electronic computing device of claim 9, wherein the memory further comprises instructions, that when executed by the processor, perform the step of instructing the maintenance robot to replace the subset of the plurality of computer components.

17. A computer program product for an electronic computing device comprising a computer readable storage medium having program instructions embodied therewith, the program instructions executable by a processor to cause the electronic computing device to perform the steps of:
predicting a failure rate for a plurality of computer components within a datacenter, wherein the computer components are installed within one or more racks within the datacenter;
predicting a failure time for the plurality of computer components based on the corresponding failure rate;
selecting a subset of the plurality of computer components for replacement based on the predicted failure time;
creating a route that that is a maximum priority route that visits the one or more racks containing the subset of the plurality of computer components;
sending the route to a maintenance robot;
sending a maintenance record corresponding to the subset of the plurality of computer components for replacement to the maintenance robot;
dispatching the maintenance robot to travel the route;
identifying a replacement candidate on the maximum priority route;
checking a time constraint for the maximum priority route with a replacement candidate added; and
adding the replacement candidate to the maximum priority route in response to the time constraint being met.

18. The computer program product of claim 17, wherein the computer readable storage medium includes program instructions executable by the processor to cause the electronic computing device to perform the steps of:
instructing the maintenance robot to remove the subset of the plurality of computer components; and
instructing a second maintenance robot to install a new instance of each of the subset of the plurality of computer components.

* * * * *